(12) United States Patent
Lee et al.

(10) Patent No.: US 9,985,082 B2
(45) Date of Patent: May 29, 2018

(54) ORGANIC LIGHT EMITTING DISPLAY DEVICE COMPRISING MULTI-TYPE THIN FILM TRANSISTOR AND METHOD OF MANUFACTURING THE SAME

(71) Applicant: LG Display Co., Ltd., Seoul (KR)

(72) Inventors: Seok Woo Lee, Bucheon-si (KR); Seong Pil Cho, Goyang-si (KR)

(73) Assignee: LG Display Co., Ltd., Seoul (KR)

(*) Notice: Subject to any disclaimer, the term of this patent is extended or adjusted under 35 U.S.C. 154(b) by 0 days. days.

(21) Appl. No.: 15/624,559

(22) Filed: Jun. 15, 2017

(65) Prior Publication Data
US 2018/0012947 A1 Jan. 11, 2018

(30) Foreign Application Priority Data

Jul. 6, 2016 (KR) .................. 10-2016-0085783
Oct. 31, 2016 (KR) .................. 10-2016-0143773
Oct. 31, 2016 (KR) .................. 10-2016-0143777

(51) Int. Cl.
*H01L 27/32* (2006.01)
*H01L 27/12* (2006.01)
(Continued)

(52) U.S. Cl.
CPC ...... *H01L 27/3262* (2013.01); *H01L 27/3258* (2013.01); *H01L 27/3265* (2013.01); *H01L 27/3272* (2013.01); *H01L 27/1225* (2013.01); *H01L 27/1248* (2013.01); *H01L 27/1251* (2013.01); *H01L 27/1255* (2013.01); *H01L 29/4908* (2013.01); *H01L 29/7869* (2013.01);
(Continued)

(58) Field of Classification Search
None
See application file for complete search history.

(56) References Cited

U.S. PATENT DOCUMENTS

2009/0002590 A1* 1/2009 Kimura ............... H01L 27/1214
349/43
2014/0339527 A1 11/2014 Lee et al.
2017/0358688 A1* 12/2017 Lee ..................... H01L 27/1244

FOREIGN PATENT DOCUMENTS

EP  2911196  8/2015
EP  2911199  8/2015
KR  20150100566  9/2015

OTHER PUBLICATIONS

Extended European Search Report for European Patent Application No. EP 17179709.5, Dec. 19, 2017, 9 pages.

* cited by examiner

Primary Examiner — Asok K Sarkar
(74) Attorney, Agent, or Firm — Fenwick & West LLP

(57) ABSTRACT

An organic light emitting display device includes a driving TFT on the substrate, a switching TFT on the substrate, and an organic light emitting diode. The driving TFT includes a first active layer formed of poly-Si, and at least a first part of an interlayer insulation layer on the first active layer. The interlayer insulation layer is formed of a first material including hydrogen. The switching TFT includes a second active layer, at least a second part of the interlayer insulation layer between the first active layer and the second active layer, and at least a part of a gate insulation layer between the second part of the interlayer insulation layer and the second active layer. The gate insulation layer is formed from a second material different from the first material and blocking diffusion of hydrogen from the interlayer insulation layer to the second active layer.

19 Claims, 23 Drawing Sheets

(51) Int. Cl.
*H01L 29/49* (2006.01)
*H01L 29/786* (2006.01)
(52) U.S. Cl.
CPC .. *H01L 29/78633* (2013.01); *H01L 29/78675* (2013.01); *H01L 2227/323* (2013.01)

| | COMPARATIVE EXAMPLE | EXAMPLE 1 | EXAMPLE 2 |
|---|---|---|---|
| Vth MAP |  |  |  |
| Vth VARIATION RANGE | -3.73 ~ 0.47V | -1.21 ~ 0.89V | -0.85 ~ 0.57V |

ORGANIC LIGHT EMITTING DISPLAY DEVICE COMPRISING MULTI-TYPE THIN FILM TRANSISTOR AND METHOD OF MANUFACTURING THE SAME

CROSS-REFERENCE TO RELATED APPLICATIONS

This application claims the priority of Republic of Korea Patent Application No. 10-2016-0085783 filed on Jul. 6, 2016, Republic of Korea Patent Application No. 10-2016-0143777 filed on Oct. 31, 2016 and Republic of Korea Patent Application No. 10-2016-0143773 filed on Oct. 31, 2016, in the Korean Intellectual Property Office, the disclosure of each of which is incorporated herein by reference.

BACKGROUND

Field

The present disclosure relates to an organic light emitting display device including a multi-type thin film transistor and a method of manufacturing the organic light emitting display device and more particularly, to an organic light emitting display device in which different types of thin film transistors are disposed on a single substrate and a method of manufacturing the organic light emitting display device.

Description of the Related Art

Recently, as the world reached a full-scale information age, the field of display for visually displaying electrical information signals has grown rapidly. In response thereto, various flat display devices with excellent performance in terms of thinning, weight lightening, and low power consumption have been developed and have rapidly replaced cathode ray tube (CRT) displays that have been used in the art.

Specific examples of the flat display devices include a liquid crystal display (LCD) device, an organic light emitting display (OLED) device, an electro phoretic display (EPD) device, a plasma display panel (PDP) device, and an electro-wetting display (EWD) device, and the like. Particularly, the OLED device. which is a next-generation display device with self-emitting characteristics, has excellent characteristics in terms of viewing angle, contrast, response speed, power consumption, etc., as compared with the LCD device.

The OLED device includes a display area where an organic light emitting element for displaying an image and a pixel circuit for driving the organic light emitting element are disposed. Also, the OLED device includes a non-display area which is adjacent to the display area and in which a driving circuit is disposed. Particularly, a plurality of thin film transistors is positioned in the pixel circuit and the driving circuit so as to drive organic light emitting elements in a plurality of pixels.

The thin film transistors can be classified by the material of an active layer. Particularly, a low temperature polysilicon (LTPS) thin film transistor and an oxide semiconductor thin film transistor are commonly used. However, currently, in an OLED device, either the LTPS thin film transistor or the oxide semiconductor thin film transistor is used on a single substrate as a thin film transistor constituting a pixel circuit and a driving circuit. However, if any one of the LTPS thin film transistor or the oxide semiconductor thin film transistor constitutes the pixel circuit and the driving circuit, there are various problems. Accordingly, there has been a need to apply different types of thin film transistors to a single OLED device.

SUMMARY

The inventors of the present disclosure recognized the above-described need and researched a technology of applying different types of thin film transistors to a single substrate. Then, the inventors invented an organic light emitting display device to which an LTPS thin film transistor and an oxide semiconductor thin film transistor are applied. However, inventors of the present disclosure recognized various problems caused by application of the LTPS thin film transistor and an oxide semiconductor thin film transistor to the single substrate.

Firstly, hydrogen contained in an interlayer insulation layer of the LTPS thin film transistor and used for a hydrogenation process of an active layer of the LTPS thin film transistor may be diffused into an active layer of the oxide semiconductor thin film transistor. Thus, a threshold voltage (Vth) of the oxide semiconductor thin film transistor may be changed.

Further, inorganic films of an encapsulation unit used in an OLED device need to be formed on an organic light emitting element and thus are formed by a low-temperature process. However, the inorganic films formed by a low-temperature process contain a relatively large amount of hydrogen. Such hydrogen is diffused into the active layer of the oxide semiconductor thin film transistor, and, thus, there is a problem that the threshold voltage (Vth) of the oxide semiconductor thin film transistor may be changed.

Also, a large amount of hydrogen may be diffused into the active layer of the oxide semiconductor thin film transistor depending on the timing of an activation process and a hydrogenation process of the active layer of the LTPS thin film transistor in a manufacturing process of the organic light emitting display device.

Accordingly, an object to be achieved by the present disclosure is to provide a new structure of an organic light emitting display device for solving the above-described problems and a new method of manufacturing an organic light emitting display device.

Specifically, the object to be achieved by the present disclosure is to provide an organic light emitting display device and a method of manufacturing the organic light emitting display device. In the organic light emitting display device, a lamination structure and materials of an interlayer insulation layer of an LTPS thin film transistor and a gate insulation layer and a passivation layer of an oxide semiconductor thin film transistor are variously designed. Thus, the organic light emitting display device is capable of reducing diffusion of hydrogen from the interlayer insulation layer or an encapsulation unit of the LTPS thin film transistor into an active layer of the oxide semiconductor thin film transistor.

Another object to be achieved by the present disclosure is to provide a method of manufacturing an organic light emitting display device by which diffusion of hydrogen into an active layer of an oxide semiconductor thin film transistor can be reduced while an activation process and a hydrogenation process are performed to an LTPS thin film transistor.

The objects of the present disclosure are not limited to the aforementioned objects, and other objects, which are not mentioned above, will be apparent to a person having ordinary skill in the art from the following description.

According to an aspect of the present disclosure, there is provided an organic light emitting display device including a multi-type thin film transistor. The organic light emitting display device includes a substrate defined into a display area and a non-display area positioned on one side of the display area, an LTPS thin film transistor and an oxide semiconductor thin film transistor disposed on the display area, a lower insulation layer and an upper insulation layer respectively positioned under and on an active layer of the oxide semiconductor thin film transistor, and an organic light emitting element positioned on the LTPS thin film transistor and the oxide semiconductor thin film transistor. The lower insulation layer or the upper insulation layer is formed as a multi-layer structure having at least one difference in film density or hydrogen content to minimize exposure of the active layer to hydrogen.

According to another feature of the present disclosure, the lower insulation layer includes a first insulation layer and a second insulation layer. The second insulation layer is disposed on the first insulation layer so as to be in contact with the active layer. The first insulation layer and the second insulation layer may be formed of different materials. The second insulation layer may have a higher hydrogen content than the first insulation layer.

According to yet another feature of the present disclosure, the lower insulation layer includes a first insulation layer and a second insulation layer. The second insulation layer is disposed on the first insulation layer so as to be adjacent to the active layer. The first insulation layer and the second insulation layer may be formed of the same material. The second insulation layer may have a higher hydrogen content than the first insulation layer.

According to still another feature of the present disclosure, the upper insulation layer includes a third insulation layer and a fourth insulation layer. The third insulation layer is in contact with the active layer. The fourth insulation layer is disposed on the third insulation layer. The third insulation layer may have a higher film density than the fourth insulation layer.

According to an aspect of the present disclosure, there is provided a method of manufacturing an organic light emitting display device including a multi-type thin film transistor. The method of manufacturing an organic light emitting display device includes forming a first active layer of an LTPS thin film transistor on a substrate, forming a gate electrode of the LTPS thin film transistor on the first active layer, forming an insulation layer on the gate electrode, forming a second active layer of an oxide semiconductor thin film transistor on the insulation layer, forming a first source electrode and a first drain electrode of the oxide semiconductor thin film transistor and a second source electrode and a second drain electrode of the LTPS thin film transistor on the insulation layer, and forming a passivation layer covering the first source electrode, the second source electrode, the first drain electrode, and the second drain electrode. The first source electrode, the second source electrode, the first drain electrode, and the second drain electrode are formed of the same material at the same process. The insulation layer or the passivation layer is formed as a multi-layer structure, and each layer of the passivation layer has a different property.

According to still another feature of the present disclosure, the forming of an insulation layer includes forming a first insulation layer on the gate electrode and forming a second insulation layer on the first insulation layer. Each of the forming of a first insulation layer and the forming of a second insulation layer includes injecting an injection source into a chamber. The injection source may include a silane ($SiH_4$) gas.

According to still another feature of the present disclosure, in the forming of a first insulation layer and the forming of a second insulation layer, the first insulation layer and the second insulation layer are formed of the same material. The second insulation layer may have a higher film density than the first insulation layer to effectively block hydrogen.

According to still another feature of the present disclosure, the amount of the silane gas injected in the forming of a second insulation layer may be smaller than the amount of the silane gas injected in the forming of a first insulation layer.

Embodiments also relate to an organic light emitting display device, including a substrate and a pixel on the substrate. The pixel includes a driving thin film transistor (TFT) on the substrate, a switching TFT on the substrate, and an organic light emitting diode (OLED). The driving TFT includes a first active layer formed of poly-Si, and at least a first part of an interlayer insulation layer on the first active layer. The interlayer insulation layer is formed of a first material including hydrogen. The switching TFT includes a second active layer, at least a second part of the interlayer insulation layer between the first active layer and the second active layer, and at least a part of a gate insulation layer between the second part of the interlayer insulation layer and the second active layer. The gate insulation layer is formed from a second material different from the first material and blocking diffusion of hydrogen from the interlayer insulation layer to the second active layer. The OLED is electrically connected to the driving TFT.

Embodiments also relate to an organic light emitting display device, including a substrate and a pixel on the substrate. The pixel includes a first active layer of a first thin film transistor (TFT) on the substrate. The first active layer is formed of oxide semiconductor. The pixel also includes a second active layer of a second TFT on the substrate. The second active layer is formed of poly-Si. The pixel also includes a first insulation layer between the first active layer and the second active layer. The first insulation layer is formed of a first material including hydrogen. The pixel also includes a second insulation layer between the first insulation layer and the second first active layer. The second insulation layer is formed of a second material different from the first material and blocking diffusion of hydrogen from the first insulation layer to the second first active layer. The OLED is electrically connected to the second TFT.

Details of other exemplary embodiments will be included in the detailed description of the invention and the accompanying drawings.

According to the present disclosure, it is possible to provide an organic light emitting display device having a new structure capable of solving various problems occurring when a multi-type thin film transistor is applied to a single substrate and a method of manufacturing the new organic light emitting display device.

Specifically, according to the present disclosure, diffusion of hydrogen contained in various insulation layers within the organic light emitting display device into an active layer of an oxide semiconductor thin film transistor can be reduced. Thus, the reliability of the oxide semiconductor thin film transistor can be improved.

According to the present disclosure, an activation process and a hydrogenation process of an LTPS thin film transistor are optimized. Thus, the reliability of the oxide semiconductor thin film transistor can be improved.

The effects of the present disclosure are not limited to the aforementioned effects, and various other effects are included in the present specification.

BRIEF DESCRIPTION OF THE DRAWINGS

The above and other aspects, features and other advantages of the present disclosure will be more clearly understood from the following detailed description taken in conjunction with the accompanying drawings, in which.

DETAILED DESCRIPTION OF THE PREFERRED EMBODIMENT

Figure 1:
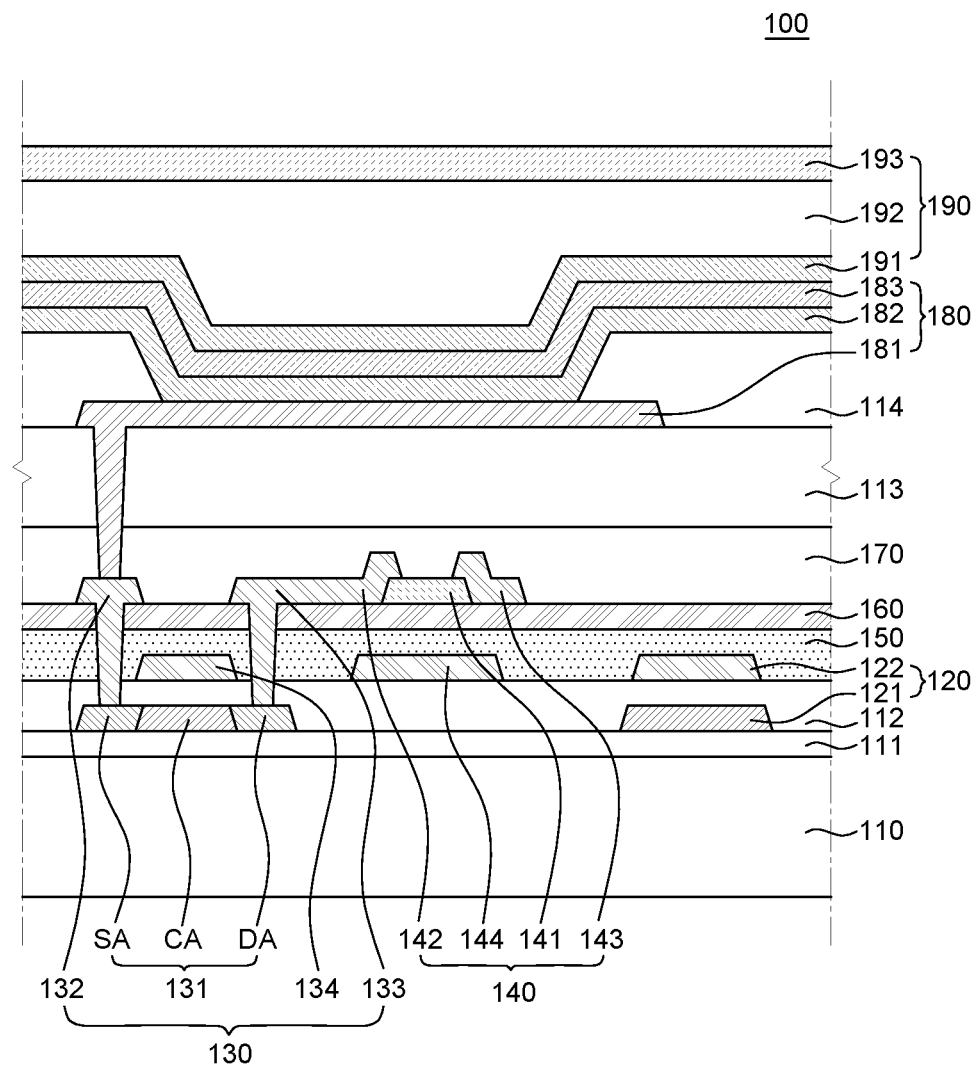
FIG. 1 is a cross-sectional view of an organic light emitting display device including a multi-type thin film transistor according to an embodiment of the present disclosure.

Advantages and features of the present disclosure, and methods for accomplishing the same will be more clearly understood from exemplary embodiments described below with reference to the accompanying drawings. However, the present disclosure is not limited to the following exemplary embodiments but may be implemented in various different forms. The exemplary embodiments are provided only to complete disclosure of the present disclosure and to fully provide a person having ordinary skill in the art to which the present disclosure pertains with the category of the disclosure, and the present disclosure will be defined by the appended claims.

The shapes, sizes, ratios, angles, numbers, and the like illustrated in the accompanying drawings for describing the exemplary embodiments of the present disclosure are merely examples, and the present disclosure is not limited thereto. Like reference numerals generally denote like elements throughout the present specification. Further, in the following description, a detailed explanation of known related technologies may be omitted to avoid unnecessarily obscuring the subject matter of the present disclosure. The terms such as "including," "having," and "consist of" used herein are generally intended to allow other components to be added unless the terms are used with the term "only". Any references to singular may include plural unless expressly stated otherwise.

Components are interpreted to include an ordinary error range even if not expressly stated.

When the position relation between two parts is described using the terms such as "on", "above", "below", and "next", one or more parts may be positioned between the two parts unless the terms are used with the term "immediately" or "directly".

When an element or layer is referred to as being "on" another element or layer, it may be directly on the other element or layer, or intervening elements or layers may be present.

Although the terms "first", "second", and the like are used for describing various components, these components are not confined by these terms. These terms are merely used for distinguishing one component from the other components. Therefore, a first component to be mentioned below may be a second component in a technical concept of the present disclosure.

Throughout the whole specification, the same reference numerals denote the same elements.

Since the size and thickness of each component illustrated in the drawings are represented for convenience in explanation, the present disclosure is not necessarily limited to the illustrated size and thickness of each component.

The features of various embodiments of the present disclosure can be partially or entirely bonded to or combined with each other and can be interlocked and operated in technically various ways as can be fully understood by a person having ordinary skill in the art, and the embodiments can be carried out independently of or in association with each other.

Hereinafter, various embodiments of the present disclosure will be described in detail with reference to the accompanying drawings.

In organic light emitting display devices each including a multi-type thin film transistor according to various embodiments of the present disclosure, at least two types of thin film transistors are formed on the same substrate. A multi-type thin film transistor refers to different types of thin film transistors formed on a single substrate. Herein, a thin film transistor including an active layer formed of a poly-silicon material and a thin film transistor including an active layer formed of a metal oxide are used as at least two types of thin film transistors.

In the organic light emitting display devices each including a multi-type thin film transistor according to various exemplary embodiments of the present disclosure, an LTPS thin film transistor using low temperature poly-silicon is used as the thin film transistor including an active layer formed of a poly-silicon material. The poly-silicon material has high mobility (100 cm$^2$/Vs or more), low energy power consumption and excellent reliability. Thus, the LTPS thin film transistor can be applied to a gate driver and/or multiplexer (MUX) for use in a driving element for driving thin film transistors for display device. Preferably, the LTPS thin film transistor may be applied to driving thin film transistors within pixels of an organic light emitting display device.

Also, in the organic light emitting display devices each including a multi-type thin film transistor according to various exemplary embodiments of the present disclosure, an oxide semiconductor thin film transistor including an active layer formed of an oxide semiconductor material is used. The oxide semiconductor material has a greater band gap than a silicon material, so that an electron cannot cross the band gap in an off state and an off-current is low. Therefore, the oxide semiconductor thin film transistor is suitable for switching thin film transistors which remain on for a short time and off for a long time. Also, since the off-current is low, the size of an auxiliary capacitance can be reduced. Therefore, the oxide semiconductor thin film transistor is suitable for high-resolution display elements.

In the organic light emitting display devices each including a multi-type thin film transistor according to various embodiments of the present disclosure, the LTPS thin film transistor and the oxide semiconductor thin film transistor having different properties are disposed on the same substrate. Thus, it is possible to provide optimum functionality.

FIG. 1 is a cross-sectional view of an organic light emitting display device including a multi-type thin film transistor according to an embodiment of the present disclosure. FIG. 1 is a cross-sectional view of a partial area of a single pixel in an organic light emitting display device 100, and illustrates an LTPS thin film transistor 130, an oxide semiconductor thin film transistor 140, and a storage capacitor 120.

Referring to FIG. 1, the organic light emitting display device 100 includes a substrate 110, a buffer layer 111, the oxide semiconductor thin film transistor 140, the LTPS thin film transistor 130, the storage capacitor 120, a gate insulation layer 112 of the LTPS thin film transistor 130, an interlayer insulation layer 150, a gate insulation layer 160 of the oxide semiconductor thin film transistor 140, a passivation layer 170, an overcoat ing layer 113, an organic light emitting element 180, and an encapsulation unit 190.

The LTPS thin film transistor 130 illustrated in FIG. 1 is a top gate or coplanar thin film transistor in which a gate electrode 134 is disposed on an active layer 131. Further, the oxide semiconductor thin film transistor 140 is a back channel etch (BCE) thin film transistor in which a gate electrode 144 is separated from a source electrode 142 and a drain electrode 143 by an active layer 141 disposed therebetween. However, the present disclosure is not limited to the above-described structure.

Hereinafter, each of the components of the organic light emitting display device 100 will be described in detail.

The substrate 110 supports various components of the organic light emitting display device 100. The substrate 110 may be formed of glass or a plastic material having flexibility. For example, the substrate 110 may be formed of polyimide (PI). If the substrate 110 is formed of polyimide (PI), a manufacturing process of an organic light emitting display device may be performed in a state where a supporting substrate formed of solid glass is disposed under the substrate 110. In this case, the supporting substrate is removed during the manufacturing process. Further, after the supporting substrate is removed, a back plate for supporting the substrate 110 may be disposed under the substrate 110.

If the substrate 110 is formed of a plastic material, moisture or hydrogen permeating into the organic light emitting display device 100 from under the substrate 110 can be suppressed more reliably. In order to shield an electrical effect from the outside more reliably, the substrate 110 may be formed as a multi-layer structure. For example, the substrate 110 may be formed as a three-layer structure including a plastic layer/an inorganic film/a plastic layer. In this case, the inorganic film may be formed of silicon nitride (SiNx) to block moisture or hydrogen more reliably, or may be formed of a metal material to shield an electrical effect more reliably. Further, a constant voltage may be applied to an inorganic film formed of a metal material, so that electrical shielding can be achieved more completely.

Referring to FIG. 1, the buffer layer 111 is formed on the entire surface of the substrate 110. The buffer layer 111 may be formed as a single layer of silicon nitride (SiNx) or silicon oxide (SiOx) or a multi-layer of silicon nitride (SiNx) and silicon oxide (SiOx). The buffer layer 111 improves an adhesive force between layers formed on the buffer layer 111 and the substrate 110 and blocks alkali elements discharged from the substrate 110. However, the buffer layer 111 is not an essential component, but may be omitted depending on the kind and material of the substrate 110 and a structure or type of the thin film transistor.

Referring to FIG. 1, the LTPS thin film transistor 130 is disposed on the buffer layer 111. The LTPS thin film transistor 130 includes the active layer 131 formed of poly-silicon, the gate electrode 134 formed of a conductive metal material, a source electrode 132, and a drain electrode 133.

The active layer 131 of the LTPS thin film transistor 130 is disposed on the buffer layer 111. The active layer of the LTPS thin film transistor 130 includes a channel area CA where a channel is formed when the LTPS thin film transistor 130 is driven and a source area SA and a drain area DA on both sides of the channel area CA. The channel area CA, the source area SA, and the drain area DA are defined by ion doping (impurity doping).

The active layer 131 of the LTPS thin film transistor 130 contains poly-silicon. An amorphous-silicon (a-Si) material is deposited on the buffer layer 111 and a dehydrogenation process and a crystallization process are performed thereto, so that poly-silicon is formed. The active layer 131 is formed by patterning the poly-silicon. Further, after the interlayer insulation layer 150 of the LTPS thin film transistor 130 to be described later is formed, an activation process and a hydrogenation process are further performed, so that the active layer 131 is completed. A manufacturing process of the active layer 131 of the LTPS thin film transistor 130 will be described later.

Referring to FIG. 1, the gate insulation layer 112 of the LTPS thin film transistor 130 is disposed on the active layer 131 and the buffer layer 111 of the LTPS thin film transistor 130. The gate insulation layer 112 of the LTPS thin film transistor 130 may be formed as a single layer of silicon nitride (SiNx) or silicon oxide (SiOx) or a multi-layer of silicon nitride (SiNx) and silicon oxide (SiOx). In the gate insulation layer 112 of the LTPS thin film transistor 130, contact holes through which the source electrode 132 and the drain electrode 133 of the LTPS thin film transistor 130 are brought into contact with the source area SA and the drain area DA of the active layer 131 of the LTPS thin film transistor 130, respectively, are formed.

Referring to FIG. 1, the gate electrode 134 of the LTPS thin film transistor 130 is disposed on the gate insulation layer 112 of the LTPS thin film transistor 130. A metal layer such as molybdenum (Mo) is formed on the gate insulation layer 112 of the LTPS thin film transistor 130, and the gate electrode 134 of the LTPS thin film transistor 130 is formed by patterning the metal layer. The gate electrode 134 of the LTPS thin film transistor 130 is disposed on the gate insulation layer 112 of the LTPS thin film transistor 130 so as to be overlapped with the channel area CA of the active layer 131 of the LTPS thin film transistor 130.

Referring to FIG. 1, the oxide semiconductor thin film transistor 140 includes the active layer 141 formed of oxide semiconductor, the gate electrode 144 formed of conductive metal, a source electrode 142, and a drain electrode 143. As described above, the oxide semiconductor thin film transistor 140 can be applied to a switching thin film transistor in a pixel circuit.

Referring to FIG. 1, the gate electrode 144 of the oxide semiconductor thin film transistor 140 is formed on the gate insulation layer 112 of the LTPS thin film transistor 130. A metal layer such as molybdenum (Mo) is formed on the gate insulation layer 112 of the LTPS thin film transistor 130, and the gate electrode 144 of the oxide semiconductor thin film transistor 140 is formed by patterning the metal layer.

The gate electrode 134 of the LTPS thin film transistor 130 and the gate electrode 144 of the oxide semiconductor thin film transistor 140 may be formed at the same process through the same process. That is, the metal layer may be formed on the gate insulation layer 112 of the LTPS thin film transistor 130 and then patterned to form the gate electrode 134 of the LTPS thin film transistor 130 and the gate electrode 144 of the oxide semiconductor thin film transistor 140 at the same process. Thus, the gate electrode 134 of the LTPS thin film transistor 130 and the gate electrode 144 of the oxide semiconductor thin film transistor 140 may be formed on the same layer and formed of the same material to the same thickness on the same layer. Since the gate electrode 134 of the LTPS thin film transistor 130 and the gate electrode 144 of the oxide semiconductor thin film transistor 140 are formed at the same process through the same process, the processing time can be reduced and the number of masks can be reduced. Thus, the processing costs can also be reduced. However, the present disclosure is not limited thereto. The gate electrode of the LTPS thin film transistor 130 may be disposed under the active layer 131, or the gate electrode of the oxide semiconductor thin film transistor 140 may be disposed on the active layer 141. Further, referring to FIG. 9, the gate electrode of the oxide semiconductor thin film transistor 140 may be disposed between the gate electrode 134 of the LTPS thin film transistor 130 and the active layer 141 of the oxide semiconductor thin film transistor 140. A detailed explanation of FIG. 9 will be provided later.

Referring to FIG. 1, the interlayer insulation layer 150 of the LTPS thin film transistor 130 is disposed on the gate electrode 134 of the LTPS thin film transistor 130 and the gate electrode 144 of the oxide semiconductor thin film transistor 140. The interlayer insulation layer 150 of the LTPS thin film transistor 130 may be formed of silicon nitride (SiNx). The interlayer insulation layer 150 functions to supply hydrogen to the active layer 131 of the LTPS thin film transistor 130. To this end, the interlayer insulation layer 150 may be formed of a first material including hydrogen. In one embodiment, the interlayer insulation layer 150 is formed of silicon nitride (SiNx) having a high hydrogen content. As defined herein, hydrogen content may refer to an amount of hydrogen in a layer or a concentration of hydrogen in the layer expressed in units of atomic percent (%) or molar percent (%). In one embodiment, the interlayer insulation layer 150 is formed of silicon nitride (SiNx) that includes 15%-25% hydrogen content. The hydrogenation process is a process for filling vacancies in the active layer 131 of the LTPS thin film transistor 130 with hydrogen. A detailed explanation of the hydrogenation process will be provided later.

The thickness of the interlayer insulation layer 150 of the LTPS thin film transistor 130 may be determined on the basis of a design value of the LTPS thin film transistor 130. In general, the LTPS thin film transistor 130 has high mobility. Thus, in order to increase the mobility of the LTPS thin film transistor 130, preferably, a large amount of hydrogen may be injected into the active layer 131 of the LTPS thin film transistor 130 during the hydrogenation process. Thus, in order to secure high mobility, the thickness of the interlayer insulation layer 150 may also be increased. Although the thickness of the interlayer insulation layer 150 is increased, there is a threshold thickness where the amount of hydrogen injected into the active layer 131 of the LTPS thin film transistor 130 is saturated by the hydrogenation process. Therefore, the thickness of the interlayer insulation layer 150 may be appropriately selected considering a target mobility and a threshold thickness of the LTPS thin film transistor 130. Therefore, the thickness of the interlayer insulation layer 150 may have various values on the basis of a target mobility, a function, and an operation of the LTPS thin film transistor 130.

In the interlayer insulation layer 150 of the LTPS thin film transistor 130, the contact holes through which the source electrode 132 and the drain electrode 133 of the LTPS thin film transistor 130 are brought into contact with the source area SA and the drain area DA of the active layer 131 of the LTPS thin film transistor 130, respectively, are formed.

Referring to FIG. 1, the gate insulation layer 160 of the oxide semiconductor thin film transistor 140 is disposed on the interlayer insulation layer 150 of the LTPS thin film transistor 130. The gate insulation layer 160 of the oxide semiconductor thin film transistor 140 may be formed of silicon oxide (SiOx). However, materials of the gate insulation layer 160 of the oxide semiconductor thin film transistor 140 and the interlayer insulation layer 150 of the LTPS thin film transistor 130 are not limited thereto. However, preferably, a material containing less hydrogen than the interlayer insulation layer 150 of the LTPS thin film transistor 130 may be selected as a material of the gate insulation layer 160 of the oxide semiconductor thin film transistor 140. Further, preferably, the gate insulation layer 160 of the oxide semiconductor thin film transistor 140 may be formed of a material having a property or quality capable of effectively blocking hydrogen diffusion. Specifically, the gate insulation layer 160 may be formed of a second material different from a first material that blocks diffusion of hydrogen from the interlayer insulation layer 150 to the active layer 141 of the oxide semiconductor TFT 140. As described above, the gate insulation layer 160 of the oxide semiconductor thin film transistor 140 suppresses the movement of hydrogen from the insulation layer 150 of the LTPS thin film transistor 130 into the active layer 141 of the oxide semiconductor thin film transistor 140. If the active layer 141 of the oxide semiconductor thin film transistor 140 is exposed to hydrogen, reduction may occur in the active layer 141 of the oxide semiconductor thin film transistor 140. Accordingly, there may be a change in threshold voltage Vth of the oxide semiconductor thin film transistor 140. Therefore, the gate insulation layer 160 of the oxide semiconductor thin film transistor 140 is disposed between the interlayer insulation layer 150 of the LTPS thin film transistor 130 having a high hydrogen content and the active layer 141 of the oxide semiconductor thin film transistor 140. Thus, it is possible to suppress the movement of hydrogen from the interlayer insulation layer 150 of the LTPS thin film transistor 130 into the active layer 141 of the oxide semiconductor thin film transistor 140. Further, in a structure where the gate insulation layer 160 of the oxide semiconductor thin film transistor 140 is in direct contact with the active layer 141 of the oxide semiconductor thin film transistor 140, the gate insulation layer 160 of the oxide semiconductor thin film transistor 140 has a relatively low hydrogen content. Therefore, an effect of hydrogen may be reduced as compared with a structure where the interlayer insulation layer 150 is in direct contact with the active layer 141 of the oxide semiconductor thin film transistor 140. In one embodiment, the gate insulation layer 160 is formed of silicon oxide (SiOx) that includes 2%-5% hydrogen content.

Thus, in the organic light emitting display device 100 according to an exemplary embodiment of the present disclosure, the gate insulation layer 160 of the oxide semiconductor thin film transistor 140 may be further disposed between the interlayer insulation layer 150 of the LTPS thin film transistor 130 and the active layer 141 of the oxide semiconductor thin film transistor 140. Therefore, it is possible to more effectively reduce diffusion of hydrogen contained in the interlayer insulation layer 150 of the LTPS thin film transistor 130 into the active layer 141 of the oxide semiconductor thin film transistor 140. Accordingly, reduction of the active layer 141 of the oxide semiconductor thin film transistor 140 can be minimized. Also, a change in threshold voltage Vth of the oxide semiconductor thin film transistor 140 can be minimized.

In the gate insulation layer 160 of the oxide semiconductor thin film transistor 140, the contact holes through which the source electrode 132 and the drain electrode 133 of the LTPS thin film transistor 130 are brought into connect with the source area SA and the drain area DA of the active layer 131 of the LTPS thin film transistor 130, respectively, are formed.

Hereinafter, an effect of suppressing hydrogen diffusion by the interlayer insulation layer 150 of the LTPS thin film transistor 130 and the gate insulation layer 160 of the oxide semiconductor thin film transistor 140 will be described in more detail with reference to FIG. 2A through FIG. 2C.

Figure 2A:
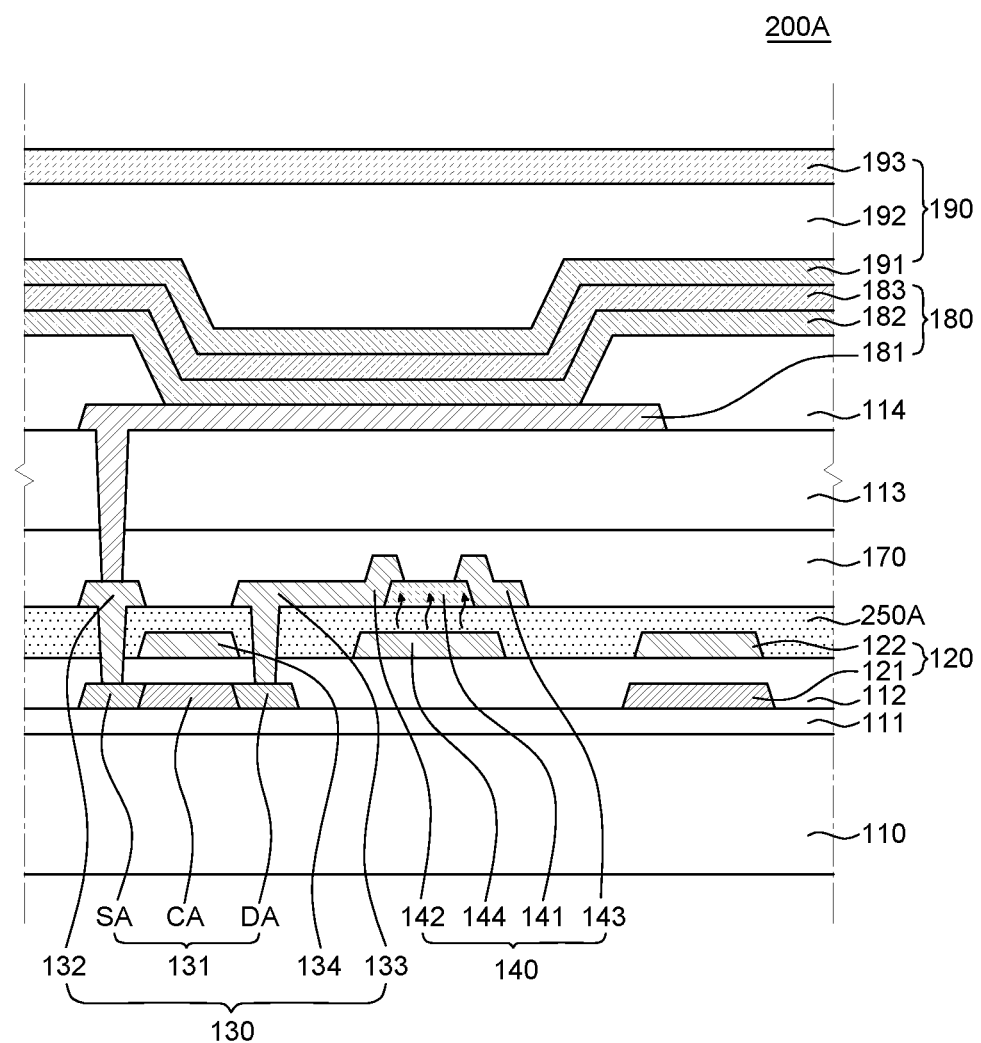
FIG. 2A and FIG. 2B are cross-sectional views provided to explain an effect of hydrogen diffusion from an interlayer insulation layer on an oxide semiconductor thin film transistor in an organic light emitting display device according to a Comparative Example.
Figure 2B:
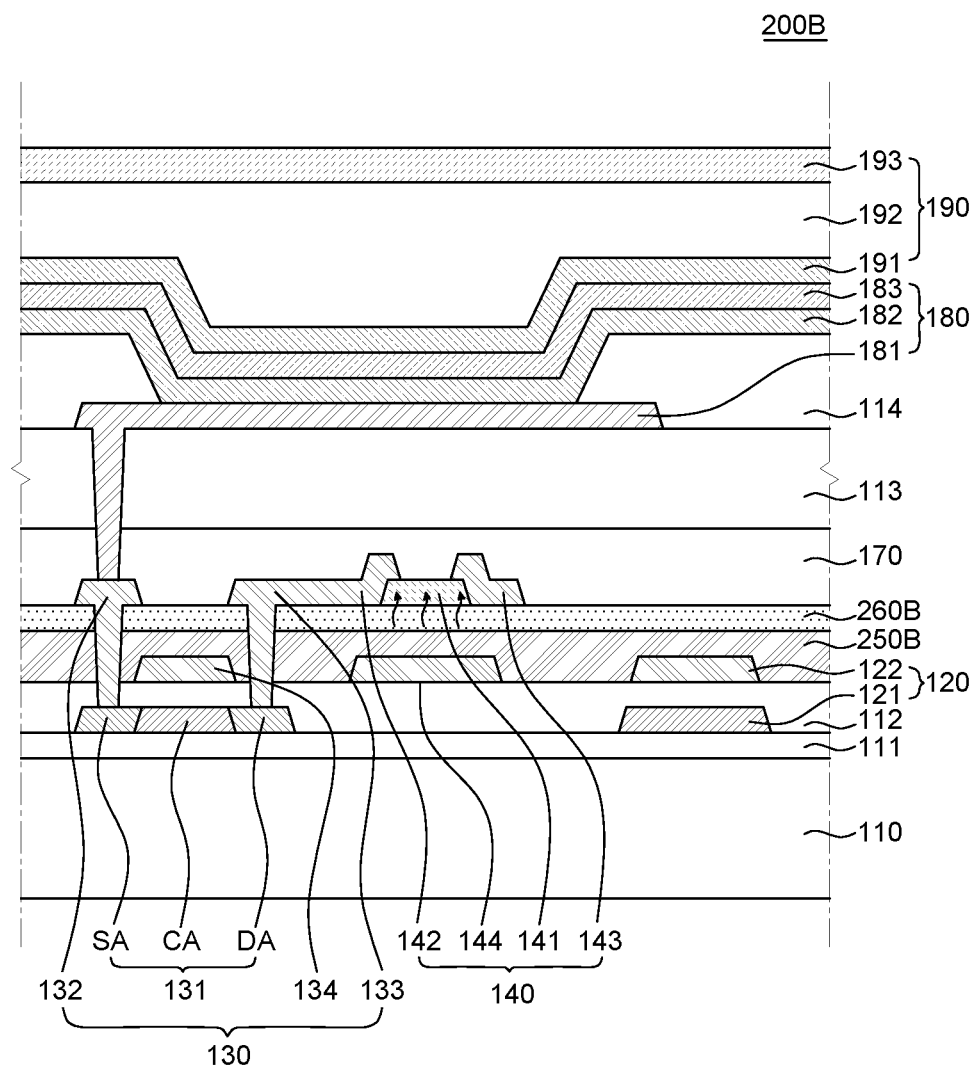

FIG. 2A and FIG. 2B are cross-sectional views provided to explain an effect of hydrogen diffusion from an interlayer insulation layer on an oxide semiconductor thin film transistor in an organic light emitting display device according to a Comparative Example. FIG. 2A and FIG. 2B are cross-sectional views of Comparative Examples where a configuration of the interlayer insulation layer 150 of the LTPS thin film transistor 130 and the gate insulation layer 160 of the oxide semiconductor thin film transistor 140 in the organic light emitting display device 100 including a multi-type thin film transistor according to an exemplary embodiment of the present disclosure as illustrated in FIG. 1 is modified.

Referring to FIG. 2A, in an organic light emitting display device 200A of Comparative Example, an interlayer insulation layer 250A of the LTPS thin film transistor 130 formed of silicon nitride (SiNx) is disposed to cover the gate electrode 134 of the LTPS thin film transistor 130 and the gate electrode 144 of the oxide semiconductor thin film transistor 140. The active layer 141 of the oxide semiconductor thin film transistor 140 is disposed on the interlayer insulation layer 250A of the LTPS thin film transistor 130. Therefore, in the organic light emitting display device 200A of Comparative Example as illustrated in FIG. 2A, the active layer 141 of the oxide semiconductor thin film transistor 140 is disposed to be in direct contact with the interlayer insulation layer 250A of the LTPS thin film transistor 130 formed of silicon nitride (SiNx).

In a structure of the organic light emitting display device 200A of Comparative Example as described above, the active layer 141 of the oxide semiconductor thin film transistor 140 is in direct contact with the interlayer insulation layer 250A of the LTPS thin film transistor 130 formed of silicon nitride (SiNx). Thus, hydrogen may be diffused from the interlayer insulation layer 250A of the LTPS thin film transistor 130 into the active layer 141 of the oxide semiconductor thin film transistor 140 (as indicated by arrows). Particularly, the activation process and the hydrogenation process may be performed to the active layer 131 of the LTPS thin film transistor 130 after the active layer 141 of the oxide semiconductor thin film transistor 140 is formed. In this case, a larger amount of hydrogen may be moved from the interlayer insulation layer 250A of the LTPS thin film transistor 130 into the active layer 141 of the oxide semiconductor thin film transistor 140 due to high temperature applied during the activation process and the hydrogenation process. Thus, reduction may occur in the active layer 141 of the oxide semiconductor thin film transistor 140 and the threshold voltage Vth of the oxide semiconductor thin film transistor 140 may be changed.

Then, referring to FIG. 2B, in an organic light emitting display device 200B of Comparative Example, an interlayer insulation layer 250B of the LTPS thin film transistor 130 formed of silicon oxide (SiOx) is disposed to cover the gate electrode 134 of the LTPS thin film transistor 130 and the gate electrode 144 of the oxide semiconductor thin film transistor 140. Also, a gate insulation layer 260B of the oxide semiconductor thin film transistor 140 formed of silicon nitride (SiNx) is disposed on the interlayer insulation layer 250B of the LTPS thin film transistor 130. That is, in the organic light emitting display device 200B of Comparative Example as illustrated in FIG. 2B, the material of the interlayer insulation layer 150 of the LTPS thin film transistor 130 and the material of the gate insulation layer 160 of the oxide semiconductor thin film transistor 140 are reversed with each other as compared with the organic light emitting display device 100 according to an embodiment of the present disclosure as illustrated in FIG. 1. Therefore, in the organic light emitting display device 200B of Comparative Example as illustrated in FIG. 2B, the active layer 141 of the oxide semiconductor thin film transistor 140 is disposed to be in direct contact with the interlayer insulation layer 250B of the LTPS thin film transistor 130 formed of silicon nitride (SiNx).

In a structure of the organic light emitting display device 200B of the Comparative Example as described above, the active layer 141 of the oxide semiconductor thin film transistor 140 is in direct contact with the gate insulation layer 260B of the oxide semiconductor thin film transistor 140 formed of silicon nitride (SiNx). Thus, hydrogen may be diffused from the gate insulation layer 260B of the oxide semiconductor thin film transistor 140 into the active layer 141 of the oxide semiconductor thin film transistor 140 (as indicated by arrows). Particularly, the activation process and the hydrogenation process may be performed to the active layer 131 of the LTPS thin film transistor 130 after the active layer 141 of the oxide semiconductor thin film transistor 140 is formed. In this case, a larger amount of hydrogen may be moved from the gate insulation layer 260B of the oxide semiconductor thin film transistor 140 into the active layer 141 of the oxide semiconductor thin film transistor 140 due to high temperature applied during the activation process and the hydrogenation process. Thus, reduction may occur in the active layer 141 of the oxide semiconductor thin film transistor 140 and the threshold voltage Vth of the oxide semiconductor thin film transistor 140 may be changed.

A distance between the active layer 131 of the LTPS thin film transistor 130 and the gate insulation layer 260B of the oxide semiconductor thin film transistor 140 formed of silicon nitride (SiNx) is greater than a distance between the active layer 131 of the LTPS thin film transistor 130 and the interlayer insulation layer 150 formed of silicon nitride (SiNx) in the organic light emitting display device 100 according to an exemplary embodiment of the present disclosure illustrated in FIG. 1. Thus, when the hydrogenation process is performed to the active layer 131 of the LTPS thin film transistor 130, the degree of diffusion of hydrogen to the active layer 131 of the LTPS thin film transistor 130 can be reduced.

Figure 2C:
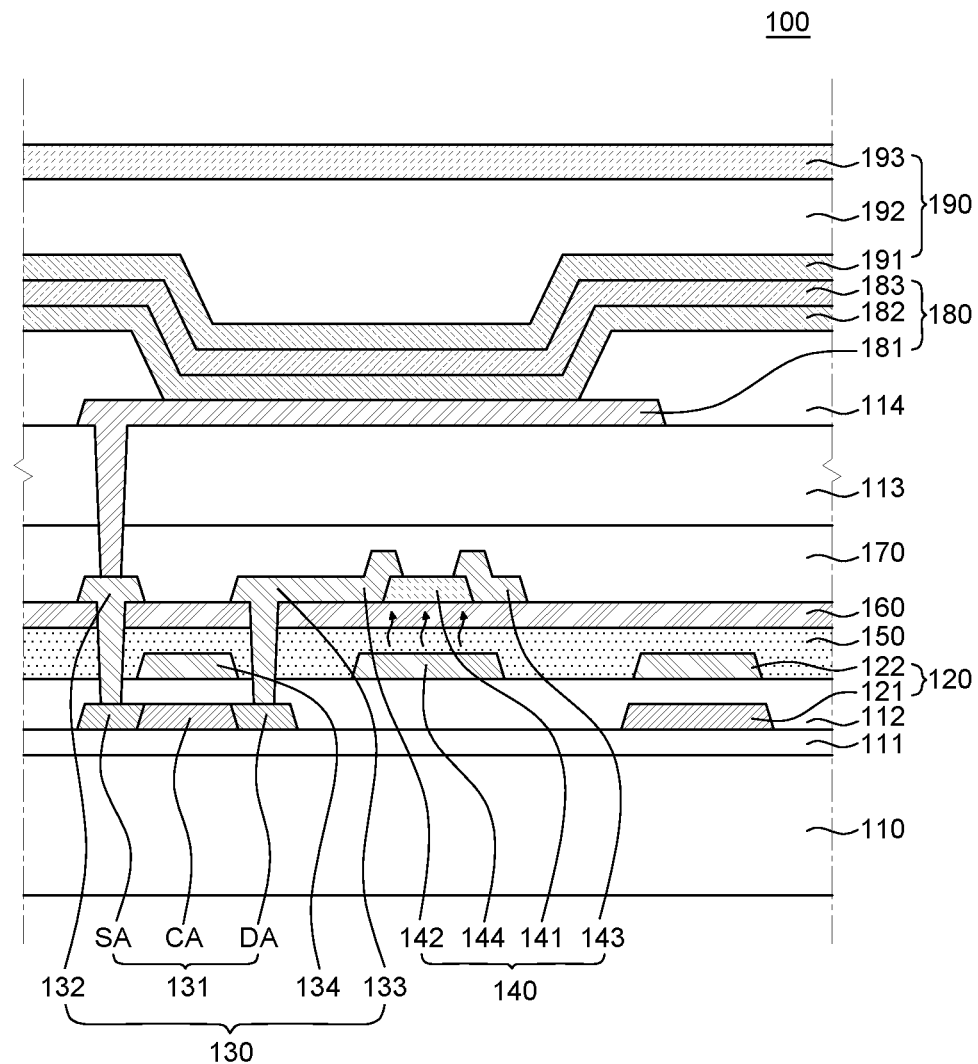
FIG. 2C is a cross-sectional view provided to explain an effect of hydrogen diffusion from an interlayer insulation layer on an oxide semiconductor thin film transistor in an organic light emitting display device including a multi-type thin film transistor according to an embodiment of the present disclosure.

FIG. 2C is a cross-sectional view provided to explain an effect of hydrogen diffusion from an interlayer insulation layer on an oxide semiconductor thin film transistor in an organic light emitting display device including a multi-type thin film transistor according to an embodiment of the present disclosure. The organic light emitting display device 100 illustrated in FIG. 2C is the same as the organic light emitting display device 100 including a multi-type thin film transistor illustrated in FIG. 1.

Referring to FIG. 2C, in the organic light emitting display device 100 according to an exemplary embodiment of the present disclosure, the gate insulation layer 160 of the oxide semiconductor thin film transistor 140 formed of silicon oxide (SiOx) is disposed between the interlayer insulation layer 150 of the LTPS thin film transistor 130 formed of silicon nitride (SiNx) and the active layer 141 of the oxide semiconductor thin film transistor 140. Therefore, it is possible to suppress diffusion of hydrogen from the interlayer insulation layer 150 of the LTPS thin film transistor 130 into the active layer 141 of the oxide semiconductor thin film transistor 140. Particularly, the activation process and the hydrogenation process may be performed to the active layer 131 of the LTPS thin film transistor 130 after the active layer 141 of the oxide semiconductor thin film transistor 140 is formed. Even in this case, diffusion of hydrogen into the active layer 141 of the oxide semiconductor thin film transistor 140 (as indicated by arrows) can be suppressed. Therefore, in the organic light emitting display device 100 according to an embodiment of the present disclosure, the interlayer insulation layer 150 of the LTPS thin film transistor 130 and the gate insulation layer 160 of the oxide semiconductor thin film transistor 140 having a structure and a lamination relationship different from the conventional organic light emitting display devices 200A and 200B of Comparative Examples are used. Thus, the amount of hydrogen diffused into the active layer 141 of the oxide semiconductor thin film transistor 140 can be reduced. Therefore, a change in threshold voltage (Vth) of the oxide semiconductor thin film transistor 140 can be minimized.

In FIG. 1 and FIG. 2C, the interlayer insulation layer 150 of the LTPS thin film transistor 130 is defined as a single layer formed of silicon nitride (SiNx) and the gate insulation layer 160 of the oxide semiconductor thin film transistor 140 is defined as a single layer formed of silicon oxide (SiOx). However, the interlayer insulation layer 150 of the LTPS thin film transistor 130 may include a lower layer formed of silicon nitride (SiNx) and an upper layer formed of silicon oxide (SiOx) and the gate insulation layer 160 of the oxide semiconductor thin film transistor 140 may be omitted. Otherwise, the interlayer insulation layer 150 of the LTPS thin film transistor 130 may be omitted and the gate insulation layer 160 of the oxide semiconductor thin film transistor 140 may include a lower layer formed of silicon nitride (SiNx) and an upper layer formed of silicon oxide (SiOx).

In some exemplary embodiments, the interlayer insulation layer 150 of the LTPS thin film transistor 130 may be patterned. That is, in order to minimize diffusion of hydrogen from the interlayer insulation layer 150 into the active layer 141 of the oxide semiconductor thin film transistor 140, the interlayer insulation layer 150 may be patterned to be overlapped only with the LTPS thin film transistor 130. Therefore, the area of the interlayer insulation layer 150 having a relatively high hydrogen content is reduced. Thus, exposure of the active layer 141 of the oxide semiconductor thin film transistor 140 to hydrogen can be minimized.

Referring to FIG. 1 again, the active layer 141 of the oxide semiconductor thin film transistor 140 is disposed on the gate insulation layer 160 of the oxide semiconductor thin film transistor 140. The active layer 141 of the oxide semiconductor thin film transistor 140 is formed of a metal oxide, and may be formed of various metal oxides such as IGZO. The active layer 141 of the oxide semiconductor thin film transistor 140 may be formed by depositing a metal oxide on the gate insulation layer 160 of the oxide semiconductor thin film transistor 140, performing a heat treatment thereto for stabilization, and patterning the metal oxide.

Referring to FIG. 1, the source electrode 142 and the drain electrode 143 are formed directly on the active layer 141 of the oxide semiconductor thin film transistor 140. The active layer 141 of the oxide semiconductor thin film transistor 140 is electrically connected to the source electrode 142 and the drain electrode 143 through ohmic contact. Therefore, the active layer 141 of the oxide semiconductor thin film transistor 140 does not necessarily require a conducting process. A manufacturing process of the active layer 141 of the oxide semiconductor thin film transistor 140 will be described later.

Referring to FIG. 1, the source electrode 132 and the drain electrode 133 of the LTPS thin film transistor 130 and the source electrode 142 and the drain electrode 143 of the oxide semiconductor thin film transistor 140 are disposed on the gate insulation layer 160 of the oxide semiconductor thin film transistor 140 on which the active layer 141 of the oxide semiconductor thin film transistor 140 is disposed. The source electrode 132 and the drain electrode 133 of the LTPS thin film transistor 130 and the source electrode 142 and the drain electrode 143 of the oxide semiconductor thin film transistor 140 may be formed of a conductive metal material, and may be formed as a three-layer structure including, e.g., titanium (Ti)/aluminum (Al)/titanium (Ti).

The source electrode 132 and the drain electrode 133 of the LTPS thin film transistor 130 are respectively connected to the source area SA and the drain area DA of the active layer 131 of the LTPS thin film transistor 130 through the contact holes formed in the gate insulation layer 112 of the LTPS thin film transistor 130, the interlayer insulation layer 150 of the LTPS thin film transistor 130, and the gate insulation layer 160 of the oxide semiconductor thin film transistor 140. Further, the source electrode 142 and the drain electrode 143 of the oxide semiconductor thin film transistor 140 are respectively connected to both sides of the active layer 141 of the oxide semiconductor thin film transistor 140.

The source electrode 132 and the drain electrode 133 of the LTPS thin film transistor 130 and the source electrode 142 and the drain electrode 143 of the oxide semiconductor thin film transistor 140 may be formed at the same process through the same process. That is, a source/drain material layer is formed on the gate insulation layer 160 of the oxide semiconductor thin film transistor 140 and the source/drain material layer is patterned to form the source electrode 132 and the drain electrode 133 of the LTPS thin film transistor 130 and the source electrode 142 and the drain electrode 143 of the oxide semiconductor thin film transistor 140 at the same process. Thus, the source electrode 132 and the drain electrode 133 of the LTPS thin film transistor 130 and the source electrode 142 and the drain electrode 143 of the oxide semiconductor thin film transistor 140 may be formed of the same material to the same thickness. Since the source electrode 132 and the drain electrode 133 of the LTPS thin film transistor 130 and the source electrode 142 and the drain electrode 143 of the oxide semiconductor thin film transistor 140 are formed at the same process through the same process, the processing time can be reduced and the number of masks can be reduced. Thus, the processing costs can also be reduced.

Referring to FIG. 1, the passivation layer 170 is disposed on the LTPS thin film transistor 130 and the oxide semiconductor thin film transistor 140. The passivation layer 170 is an insulation layer configured to protect the LTPS thin film transistor 130 and the oxide semiconductor thin film transistor 140. Further, the passivation layer 170 may also function to block hydrogen diffused from above the LTPS thin film transistor 130 and the oxide semiconductor thin film transistor 140. In the passivation layer 170, a contact hole through which the source electrode 132 of the LTPS thin film transistor 130 is exposed is formed.

The passivation layer 170 will be described in more detail with reference to FIG. 3A and FIG. 3B.

Figure 3A:
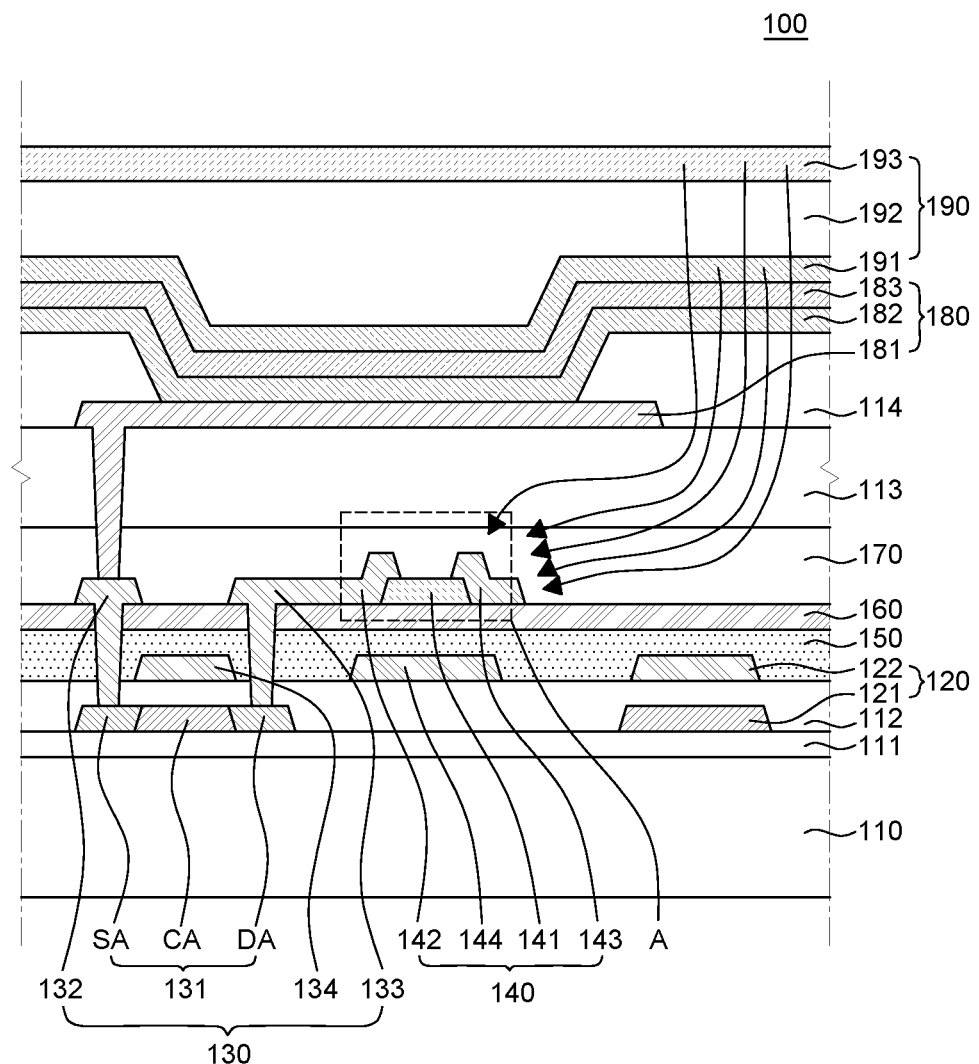
FIG. 3A is a cross-sectional view provided to explain an effect of hydrogen diffusion from an encapsulation unit on an oxide semiconductor thin film transistor in an organic light emitting display device including a multi-type thin film transistor according to an embodiment of the present disclosure.

FIG. 3A is a cross-sectional view provided to explain an effect of hydrogen diffused from an encapsulation unit on an oxide semiconductor thin film transistor in an organic light emitting display device including a multi-type thin film transistor according to an embodiment of the present disclosure. The organic light emitting display device 100 including a multi-type thin film transistor illustrated in FIG. 3A is the same as the organic light emitting display device 100 illustrated in FIG. 1.

Referring to FIG. 3A, the encapsulation unit 190 is disposed on the passivation layer 170. The encapsulation unit 190 protects the organic light emitting element 180 vulnerable to moisture so as not to be exposed to moisture. The encapsulation unit 190 may have a structure in which inorganic layers 191 and 193 and an organic layer 192 are alternately laminated. The encapsulation unit 190 illustrated in FIG. 3A has a structure in which a first inorganic layer 191, an organic layer 192, and a second inorganic layer 193 are laminated in sequence. In this case, the first inorganic layer 191 and the second inorganic layer 193 may be formed of an inorganic material such as silicon nitride (SiNx) to effectively suppress permeation of moisture into the organic light emitting element 180. Herein, the first inorganic layer 191 and the second inorganic layer 193 need to be formed on the organic light emitting element 180, but the organic light emitting element 180 is very vulnerable to high temperature. Therefore, the first inorganic layer 191 and the second inorganic layer 193 are formed by a low-temperature process such as low-temperature deposition. The first inorganic layer 191 and the second inorganic layer 193 formed by a low-temperature process have a higher hydrogen content than an inorganic layer formed by a high-temperature process. Therefore, after the organic light emitting display device 100 is manufactured, hydrogen can be diffused (as indicated by arrows) from the first inorganic layer 191 and the second inorganic layer 193 of the encapsulation unit 190 as illustrated in FIG. 3A. Then, the diffused hydrogen can reach the active layer 141 of the oxide semiconductor thin film transistor 140. If hydrogen is diffused into the active layer 141 of the oxide semiconductor thin film transistor 140 as such, reduction may occur in the active layer 141 of the oxide semiconductor thin film transistor 140 and the threshold voltage Vth of the oxide semiconductor thin film transistor 140 may be changed. Thus, in the organic light emitting display device 100 according to an embodiment of the present disclosure, the passivation layer 170 is formed to have a specific lamination structure. The passivation layer 170 will be described in more detail with reference to FIG. 3B.

Figure 3B:
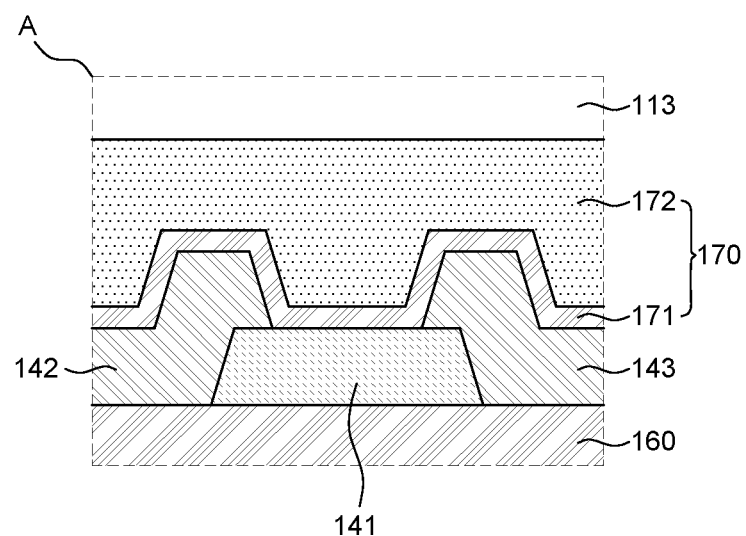
FIG. 3B is an enlarged view of an area A of FIG. 3A.

FIG. 3B is an enlarged view of an area A of FIG. 3A.

Referring to FIG. 3B, the passivation layer 170 has a multi-layer structure including a first passivation layer 171 and a second passivation layer 172. Specifically, the first passivation layer 171 is disposed to cover the active layer 141 of the oxide semiconductor thin film transistor 140, the source electrode 132 and the drain electrode 133 of the LTPS thin film transistor 130, and the gate insulation layer 160 of the oxide semiconductor thin film transistor 140. Further, the second passivation layer 172 is disposed on the first passivation layer 171. Meanwhile, the first passivation layer 171 may be formed of silicon oxide (SiOx) and the second passivation layer 172 may be formed of silicon nitride (SiNx). The passivation layer 170 protects the oxide semiconductor thin film transistor 140 and the LTPS thin film transistor 130 against moisture or hydrogen permeating from above the passivation layer 170.

A typically used passivation layer is formed as a single layer of silicon nitride (SiNx). Meanwhile, the passivation layer 170 is disposed in direct contact with the active layer 141 of the oxide semiconductor thin film transistor 140. Therefore, hydrogen contained in silicon nitride (SiNx) may be diffused into the active layer 141 of the oxide semiconductor thin film transistor 140. Thus, in the organic light emitting display device 100 according to an embodiment of the present disclosure, the first passivation layer 171 formed of silicon oxide (SiOx) is disposed in contact with the active layer 141 of the oxide semiconductor thin film transistor 140. Also, the second passivation layer 172 formed of silicon nitride (SiNx) is disposed on the first passivation layer 171. Thus, it is possible to effectively suppress hydrogen diffused from above the passivation layer 170.

The following Table 1 is provided to explain an effect of suppressing hydrogen diffusion by a passivation layer according to Comparative Example and the passivation layer 170 of the organic light emitting display device 100 according to an exemplary embodiment of the present disclosure.

TABLE 1

| Hydrogen plasma process | Comparative Example | | Example 1 | | Example 2 | |
| --- | --- | --- | --- | --- | --- | --- |
| | Before | After | Before | After | Before | After |
| Vth average | 0.27 V | −9.30 V | 0.08 V | −4.63 V | 0.53 V | 0.46 V |
| Vth variation | | Δ 9.57 V | | Δ 4.71 V | | Δ 0.07 V |

Comparative Example shows that the passivation layer is a single layer, and Examples 1 and 2 show that the passivation layer is a double layer. Further, in the Comparative Example, the passivation layer is formed of silicon oxide (SiOx) having a thickness of 2000 Å. In Examples 1 and 2, the first passivation layer 171 is formed of silicon oxide (SiOx) having a thickness of 1000 Å and the second passivation layer 172 is formed of silicon nitride (SiNx) having a thickness of 1000 Å. Meanwhile, in Example 1, when the second passivation layer 172 was deposited, a silane ($SiH_4$) gas was not injected as an injection source into the chamber. In Example 2, when the second passivation layer 172 was deposited, a silane ($SiH_4$) gas and an ammonia ($NH_3$) gas were injected as an injection source into the chamber and a ratio of $SiH_4$:$NH_3$ was controlled to 1:6.5. Further, the silicon oxide (SiOx) layer and the silicon nitride (SiNx) layer are formed by PECVD. In all of Comparative Example and Examples 1 and 2, the oxide semiconductor thin film transistor 140 was disposed under the passivation layer 170. Further, the oxide semiconductor thin film transistor 140 was manufactured such that a channel area has a width of 6 μm and a length of 6 μm. As described above, after the passivation layer 170 was formed on the oxide semiconductor thin film transistor 140, a hydrogen plasma process was performed to provide the same effect as diffusion of moisture from the encapsulation unit 190. The hydrogen plasma process was performed under the processing conditions of 5 kW, 3000 sccm, and 60 sec. Before and after the hydrogen plasma process, the threshold voltage Vth of the oxide semiconductor thin film transistor 140 was measured from the samples of Comparative Example and Examples 1 and 2. Further, an average value of the threshold voltages Vth before the hydrogen plasma process and an average value of the threshold voltages Vth after the hydrogen plasma process are shown. Also, a variation between the average values was also shown. In this case, the samples are 20 oxide semiconductor thin film transistors formed on a single mother substrate.

Referring to Table 1, it was confirmed that in Comparative Example, the threshold voltage (Vth) variation before and after the hydrogen plasma process was as high as A 9.57 V. In Comparative Example, only a single layer formed of silicon oxide (SiOx) was used as the passivation layer 170 to suppress hydrogen diffused from the encapsulation unit 190. However, it can be seen from Table 1 that if only the single layer formed of silicon oxide (SiOx) constitutes the passivation layer 170, the threshold voltage Vth of the oxide semiconductor thin film transistor 140 is greatly changed after the hydrogen plasma process.

In Example 1, the passivation layer 170 includes the first passivation layer 171 formed of silicon oxide (SiOx) and the second passivation layer 172 disposed on the first passivation layer 171 and formed of silicon nitride (SiNx) to solve the above-described problem. Further, in order to minimize diffusion of hydrogen from the second passivation layer 172 formed of silicon nitride (SiNx), when the second passivation layer 172 was deposited, only a silane ($SiH_4$) gas and a nitrogen ($N_2$) gas were used as an injection source but an ammonia ($NH_3$) gas was not used. The injection source refers to a material to be injected into a chamber of a PECVD system, and a thin film is formed by a reaction between gases decomposed by plasma. Referring to Table 1 in regard to Example 1, it can be seen that the threshold voltage (Vth) variation was greatly decreased to Δ 4.71 V as compared with Comparative Example. Thus, it can be seen that the passivation layer 170 of the organic light emitting display device 100 according to an embodiment of the present disclosure can effectively suppress hydrogen diffused from the encapsulation unit 190.

A structure or materials used in Example 2 were the same as those used in Example 1 except that when the second passivation layer 172 was deposited, a silane ($SiH_4$) gas, a nitrogen ($N_2$) gas, and an ammonia ($NH_3$) gas were used as an injection source and a flow rate ratio of the silane ($SiH_4$) gas to the ammonia ($NH_3$) gas was 1:6.5. Referring to Table 1 in regard to Example 2, it can be seen that the threshold voltage (Vth) variation was greatly decreased to Δ 0.07 V as compared with Comparative Example. Thus, it can be seen that the passivation layer 170 of the organic light emitting display device 100 according to an embodiment of the present disclosure can effectively suppress hydrogen diffused from the encapsulation unit 190.

Also, in Example 1 where an ammonia ($NH_3$) gas is not used as the injection source, the second passivation layer 172 formed of silicon nitride (SiNx) has a columnar crystal shape, so that a film density of the second passivation layer 172 is decreased. In Example 2 where a silane ($SiH_4$) gas and an ammonia ($NH_3$) gas are used as the injection source, a film density of the second passivation layer 172 is increased.

The second passivation layer 172 in Example 2 has a high film density and is excellent in blocking hydrogen as compared with the second passivation layer 172 in Example 1. Referring to Table 1, the threshold voltage (Vth) variation of the oxide semiconductor thin film transistor 140 is lower in Example 2 than in Example 1. Thus, the method of using a silane ($SiH_4$) gas and an ammonia ($NH_3$) gas as the injection source when the second passivation layer 172 is deposited is more effective in terms of the reliability of the oxide semiconductor thin film transistor 140. Preferably, a ratio of the silane ($SiH_4$) gas to the ammonia ($NH_3$) gas may be 1:4.5 or more. If the ratio of the silane ($SiH_4$) gas to the ammonia ($NH_3$) gas is less than 1:4.5, the threshold voltage Vth of the oxide semiconductor thin film transistor 140 may be changed. The unit of the flow rate of the silane ($SiH_4$) gas to the ammonia ($NH_3$) gas used as the injection source is sccm (Standard Cubic Centimeter per Minute; cm³/min) which refers to the amount of 1 cc gas flowing per minute.

Referring to FIG. 1 again, the storage capacitor 120 is disposed on the substrate 110. The storage capacitor 120 includes a first electrode 121 disposed on the buffer layer 111 and a second electrode 122 formed on the gate insulation layer 112 of the LTPS thin film transistor 130. The first electrode 121 of the storage capacitor 120 may be formed of the same material at the same process as the active layer 131 of the LTPS thin film transistor 130. Thus, the first electrode 121 may be disposed on a same layer as the active layer 131. A conducting process may be applied to the first electrode 121 so as to function as an electrode of the storage capacitor 120. Further, the second electrode 122 of the storage capacitor 120 may be formed of the same material at the same process as the gate electrode 134 of the LTPS thin film transistor 130. Thus, the second electrode 122 may be disposed on a same layer as the gate electrode 134. Therefore, the storage capacitor 120 can be formed during a manufacturing process of the LTPS thin film transistor 130 without any additional processes, which is efficient in terms of the processing costs and the processing time. In order to increase a capacitance of the storage capacitor 120, a third electrode of the storage capacitor 120 may be further formed on the gate insulation layer 160 of the oxide semiconductor thin film transistor 140. The third electrode may be formed of the same material through the same process as the active layer 141 of the oxide semiconductor thin film transistor 140. Thus, the third electrode may be disposed on a same layer as the active layer 141. Otherwise, the third electrode may be formed of the same material through the same process as the source electrode 132 and the drain electrode 133 of the LTPS thin film transistor 130 or the source electrode 142 and the drain electrode 143 of the oxide semiconductor thin film transistor 140.

Referring to FIG. 1, the overcoating layer 113 is disposed on the passivation layer 170. The overcoating layer 113 is an insulation layer configured to flatten upper parts of the oxide semiconductor thin film transistor 140 and the LTPS thin film transistor 130 and may be formed of an organic material. FIG. 1 illustrates that all of upper parts of various insulation layers under the overcoating layer 113 are flattened, for convenience in explanation. However, actually, there may be steps caused by the components of the oxide semiconductor thin film transistor 140 and the LTPS thin film transistor 130 or foreign materials. Thus, by flattening the upper parts of the oxide semiconductor thin film transistor 140 and the LTPS thin film transistor 130 or minimizing steps on a surface on which the organic light emitting element 180 is disposed, the organic light emitting element 180 can be formed with more reliability. Further, the overcoating layer 113 may reduce a capacitance between the source electrode 132 of the LTPS thin film transistor 130 and an anode 181. In the overcoating layer 113, the contact hole through which the source electrode 132 of the LTPS thin film transistor 130 is exposed and connected to the anode 181 is formed.

Referring to FIG. 1, the organic light emitting element 180 is disposed on the overcoating layer 113. The organic light emitting element 180 includes the anode 181 formed on the overcoating layer 113 and electrically connected to the source electrode 132 of the LTPS thin film transistor 130, an organic layer 182 disposed on the anode 181, and a cathode 183 formed on the organic layer 182. Further, the anode 181 may include a reflective layer configured to reflect a light emitted from the organic layer 182 toward the encapsulation unit 190 and a transparent conductive layer configured to supply holes to the organic layer 182. The organic layer 182 is configured to emit a light of a specific color and may include one of a red organic emission layer, a green organic emission layer, a blue organic emission layer, and a white organic emission layer. If the organic layer 182 includes the white organic emission layer, a color filter configured to convert a white light from the white organic emission layer into a light of a different color may be disposed on the organic light emitting element 180. Further, the organic layer 182 may further include various organic layers, such as a hole transport layer, a hole injection layer, an electron injection layer, an electron transport layer, etc., in addition to the organic emission layer.

Referring to FIG. 1, a bank 114 is disposed on the overcoating layer 113 so as to cover both ends of the anode 181. The bank 114 defines a pixel area by separating adjacent pixel areas in a display area.

Figure 4A:
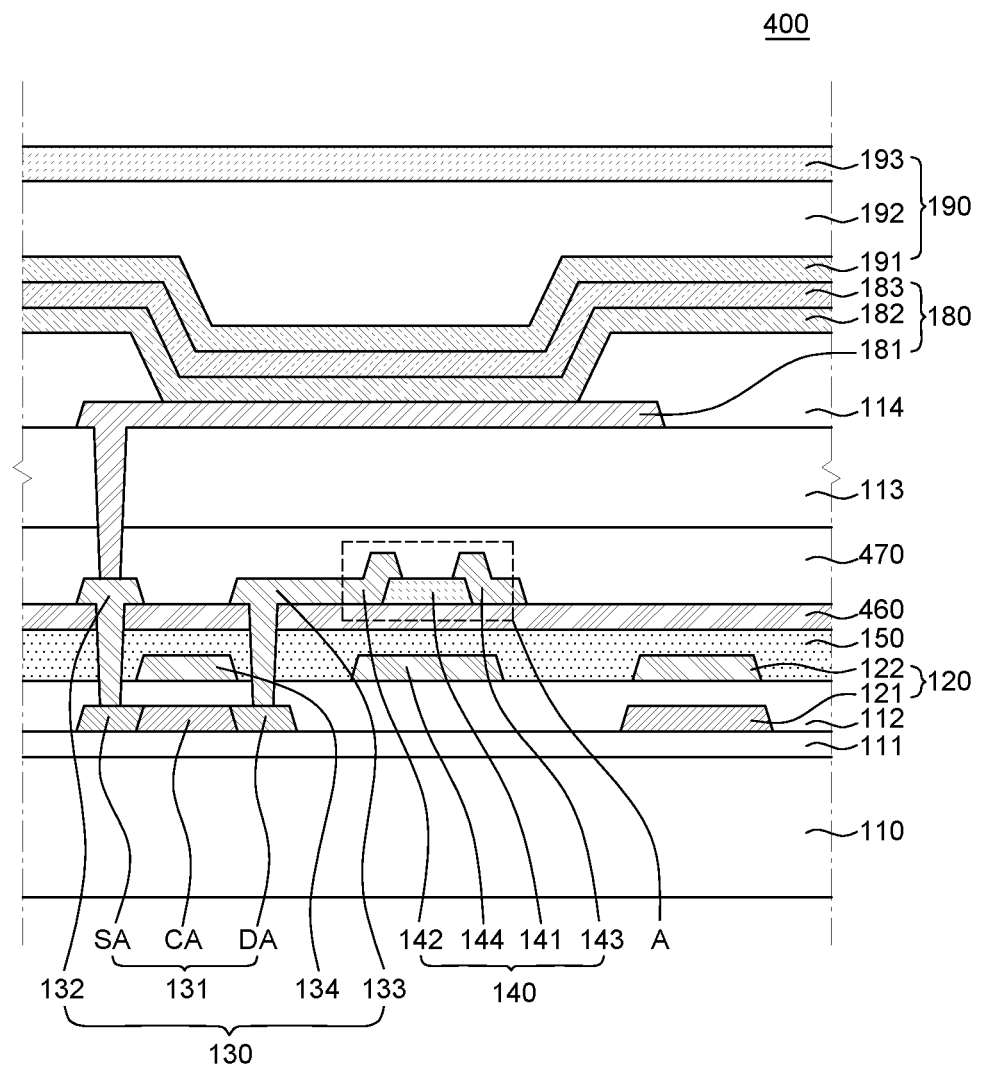
FIG. 4A is across-sectional view of an organic light emitting display device including a multi-type thin film transistor according to another embodiment of the present disclosure.
Figure 4B:
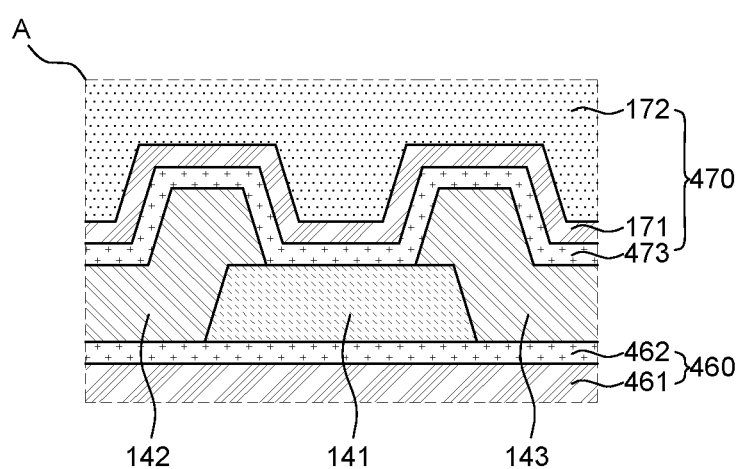
FIG. 4B is an enlarged view of an area A of FIG. 4A.

FIG. 4A is a cross-sectional view provided to explain an organic light emitting display device including a multi-type thin film transistor according to another embodiment of the present disclosure. FIG. 4B is an enlarged view of an area A of FIG. 4A. An organic light emitting display device 400 illustrated in FIG. 4A and FIG. 4B is substantially the same as the organic light emitting display device 100 illustrated in FIG. 1 except that a gate insulation layer 460 of the oxide semiconductor thin film transistor 140 and a passivation layer 470 are modified. Therefore, redundant description thereof will be omitted.

Referring to FIG. 4A and FIG. 4B, the gate insulation layer 460 of the oxide semiconductor thin film transistor 140 includes a first gate insulation layer 461 and a second gate insulation layer 462 on the first gate insulation layer 461. Since the second gate insulation layer 462 is disposed on the first gate insulation layer 461, the second gate insulation layer 462 is in contact with the active layer 141 of the oxide semiconductor thin film transistor 140. In this case, the first gate insulation layer 461 and the second gate insulation layer 462 may be formed of silicon oxide (SiOx), and the second gate insulation layer 462 may have a lower hydrogen content than the first gate insulation layer 461. Thus, a portion of the gate insulation layer 460 contacting the oxide semiconductor active layer 141 (e.g., portion corresponding to the second gate insulation layer 462) may have a lower hydrogen content than a portion of the gate insulation layer 460 spaced apart from the active layer 141 (e.g., corresponding to the first gate insulation layer 461).

The amount of an injection source used for depositing the first gate insulation layer 461 and the second gate insulation layer 462 may be adjusted to form the first gate insulation layer 461 and the second gate insulation layer 462 different from each other in hydrogen content as described above. For example, the amount of a silane ($SiH_4$) gas may be adjusted. That is, the amount of a silane ($SiH_4$) gas used for depositing the second gate insulation layer 462 may be adjusted to be smaller than the amount of a silane ($SiH_4$) gas used for depositing the first gate insulation layer 461. Then, a deposition process of the second gate insulation layer 462 is performed through as low-hydrogen process. The amount of a silane ($SiH_4$) gas in the deposition process of the second gate insulation layer 462 is set to be smaller than the amount of a silane ($SiH_4$) gas in a deposition process of the first gate insulation layer 461. Thus, the deposition process of the second gate insulation layer 462 requires a longer time than the deposition process of the first gate insulation layer 461. Therefore, in the deposition process of the second gate insulation layer 462, atoms are deposited more densely, so that the second gate insulation layer 462 has a higher film density than the first gate insulation layer 461. Thus, a portion of the gate insulation layer 460 contacting the active layer 141 (e.g., corresponding to the second gate insulation layer 462) may have a higher film density than a portion of the gate insulation layer 460 spaced apart from the active layer 141 (e.g., corresponding to the first gate insulation layer 461). Accordingly, even if the first gate insulation layer 461 and the second gate insulation layer 462 are formed of the same material, the second gate insulation layer 462 has a higher film density than the first gate insulation layer 461. Thus, it is possible to more efficiently suppress diffusion of hydrogen into the active layer 141 of the oxide semiconductor thin film transistor 140 from under the oxide semiconductor thin film transistor 140. Further, if the amount of a silane ($SiH_4$) gas used for depositing the second gate insulation layer 462 is adjusted in order for the second gate insulation layer 462 to have a lower hydrogen content than the first gate insulation layer 461, the degree of exposure of the active layer 141 of the oxide semiconductor thin film transistor 140 to hydrogen can be further reduced. Therefore, reduction of the active layer 141 of the oxide semiconductor thin film transistor 140 and a change in threshold voltage Vth of the oxide semiconductor thin film transistor 140 can be minimized. Further, a bias temperature stress (BTS) of the oxide semiconductor thin film transistor 140 can also be improved.

Meanwhile, electrons may be trapped in an interface between the gate insulation layer 460 of the oxide semiconductor thin film transistor 140 and the active layer 141 of the oxide semiconductor thin film transistor 140. In order to solve such an electron trap, a layer having a high film density may be disposed under the active layer 141 of the oxide semiconductor thin film transistor 140. Therefore, the second gate insulation layer 462 having a higher film density than the first gate insulation layer 461 may be disposed under the active layer 141 of the oxide semiconductor thin film transistor 140 to suppress the above-described electron trap. Meanwhile, the threshold voltage Vth of the oxide semiconductor thin film transistor 140 can be controlled by modifying the composition of the first gate insulation layer 461. Therefore, the gate insulation layer 460 may be formed as a multi-layer structure as described above.

The passivation layer 470 may include a third passivation layer 473, a first passivation layer 171 on the third passivation layer 473, and the second passivation layer 172 on the first passivation layer 171. Since the third passivation layer 473 is disposed under the first passivation layer 171, the third passivation layer 473 is in contact with the active layer 141 of the oxide semiconductor thin film transistor 140. In this case, the third passivation layer 473 and the first passivation layer 171 may be formed of silicon oxide (SiOx), and the third passivation layer 473 may have a lower hydrogen content than the first passivation layer 171. Thus, a portion of the passivation layer 470 contacting the oxide semiconductor active layer 141 (e.g., portion corresponding to the third passivation layer 473) may have a lower hydrogen content than a portion of the passivation layer 470 spaced apart from the active layer 141 (e.g., corresponding to the first passivation layer 171).

The amount of an injection source used for depositing the first passivation layer 171 and the third passivation layer 473 may be adjusted to form the first passivation layer 171 and the third passivation layer 473 different from each other in hydrogen content as described above. For example, the amount of a silane ($SiH_4$) gas may be adjusted. That is, the amount of a silane ($SiH_4$) gas used for depositing the third passivation layer 473 may be adjusted to be smaller than the amount of a silane ($SiH_4$) gas used for depositing the first passivation layer 171. Then, a deposition process of the third passivation layer 473 is performed through as low-hydrogen process. The amount of a silane ($SiH_4$) gas in the deposition process of the third passivation layer 473 is set to be smaller than the amount of a silane ($SiH_4$) gas in a deposition process of the first passivation layer 171. Thus, the deposition process of the third passivation layer 473 requires a longer time than the deposition process of the first passivation layer 171. Therefore, in the deposition process of the third passivation layer 473, atoms are deposited more densely, so that the third passivation layer 473 has a higher film density than the first passivation layer 171. Accordingly, even if the first passivation layer 171 and the third passivation layer 473 are formed of the same material, the third passivation layer 473 has a higher film density than the first passivation layer 171. Thus, a portion of the passivation layer 470 contacting the oxide semiconductor active layer 141 (e.g., portion corresponding to the third passivation layer 473) may have a lower hydrogen content than a portion of the passivation layer 470 spaced apart from the active layer 141 (e.g., corresponding to the first passivation layer 171). Thus, it is possible to further suppress diffusion of hydrogen into the active layer 141 of the oxide semiconductor thin film transistor 140 from above the oxide semiconductor thin film transistor 140. Further, the third passivation layer 473 has a lower hydrogen content than the first passivation layer 171. Thus, when the third passivation layer 473 is disposed under the first passivation layer 171, exposure of the active layer 141 of the oxide semiconductor thin film transistor 140 to hydrogen can be minimized. Therefore, reduction of the active layer 141 of the oxide semiconductor thin film transistor 140 and a change in threshold voltage Vth of the oxide semiconductor thin film transistor 140 can be suppressed. Further, the bias temperature stress (BTS) of the oxide semiconductor thin film transistor 140 can also be improved.

Figure 5:
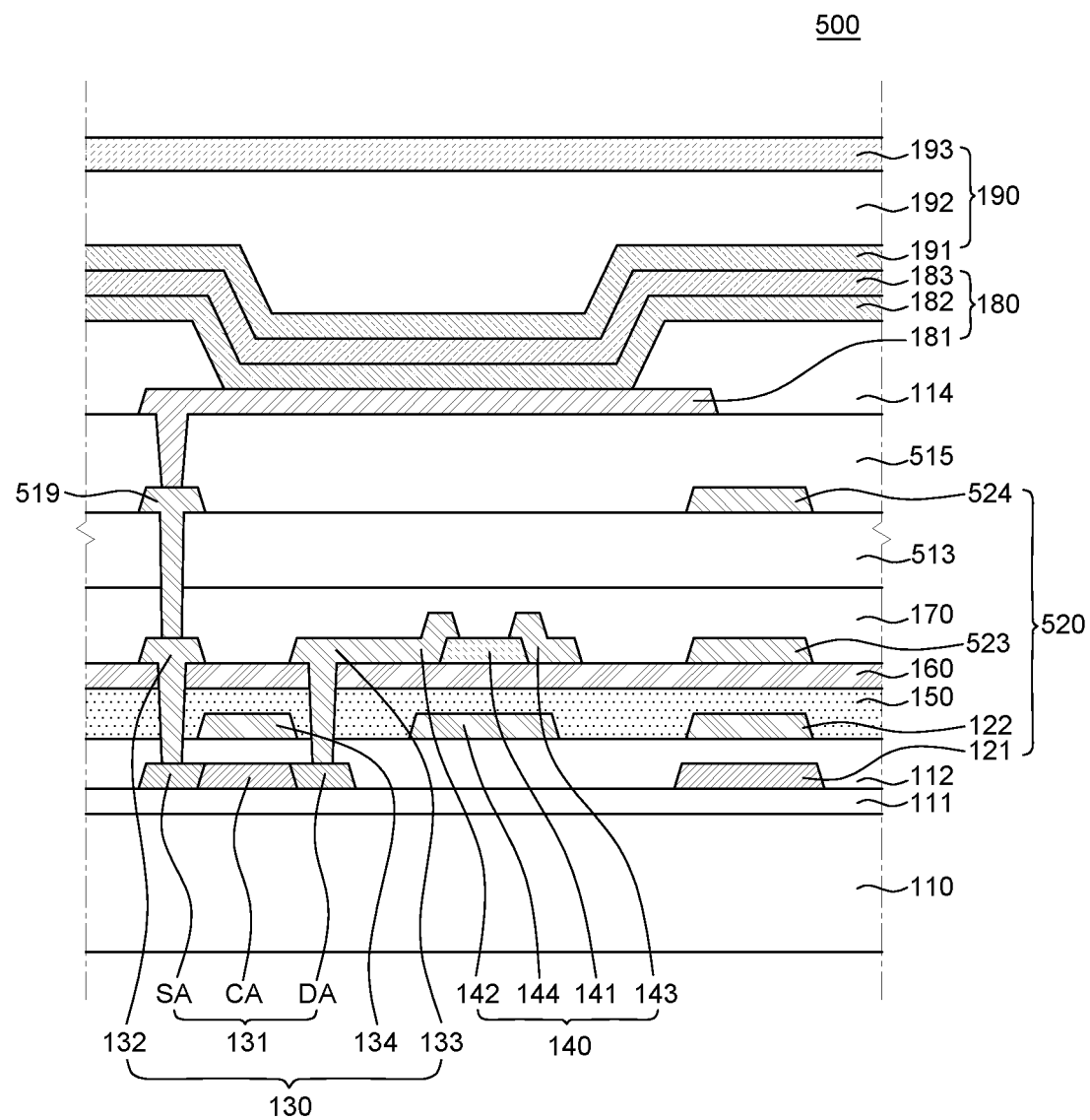
FIG. 5 is a cross-sectional view of an organic light emitting display device including a multi-type thin film transistor according to yet another embodiment of the present disclosure.

FIG. 5 is a cross-sectional view provided to explain an organic light emitting display device including a multi-type thin film transistor according to yet another embodiment of the present disclosure. An organic light emitting display device 500 illustrated in FIG. 5 is substantially the same as the organic light emitting display device 100 illustrated in FIG. 1 except that an intermediate electrode 519 is added, a storage capacitor 520 is modified, and an overcoating layer includes two layers 513 and 515. Therefore, redundant description thereof will be omitted.

Referring to FIG. 5, in the organic light emitting display device 500 according to yet another embodiment of the present disclosure, additional metal layers 523, 524, and 519 are added, so that a capacitance of the storage capacitor 520 can be increased and a line resistance can be reduced. Also, the width of a non-display area (bezel area) can be reduced.

The storage capacitor 520 includes the first electrode 121, the second electrode 122, a third electrode 523, and a fourth electrode 524 laminated in sequence. The first electrode 121 of the storage capacitor 520 may be formed of the same material at the same process as the active layer 131 of the LTPS thin film transistor 130. The second electrode 122 of the storage capacitor 520 may be formed of the same material at the same process as the gate electrode 144 of the oxide semiconductor thin film transistor 140 and the gate electrode 134 of the LTPS thin film transistor 130. Also, the third electrode 523 of the storage capacitor 520 may be formed of the same material at the same process as the source electrode 142 and the drain electrode 143 of the oxide semiconductor thin film transistor 140 and the source electrode 132 and the drain electrode 133 of the LTPS thin film transistor 130. The fourth electrode 524 of the storage capacitor 520 may be formed on a first overcoating layer 513 using an additional metal material. The first overcoating layer 513 may be formed of the same material as the overcoating layer 113 illustrated in FIG. 1 and may reduce a parasitic capacitance formed between the source electrode 132 of the LTPS thin film transistor 130 and the intermediate electrode 519. Further, in the storage capacitor 520, a capacitor using the first electrode 121 and the second electrode 122 as both terminals, a capacitor using the second electrode 122 and the third electrode 523 as both terminals, and a capacitor using the third electrode 523 and the fourth electrode 524 as both terminals may be connected in parallel with each other. Therefore, a capacitance of the storage capacitor 520 can be increased.

Then, the intermediate electrode 519 is disposed on the first overcoating layer 513. The intermediate electrode 519 is connected to the source electrode 132 of the LTPS thin film transistor 130 through a contact hole in the passivation layer 170 and the first overcoating layer 513. A second overcoating layer 515 configured to flatten upper parts of the intermediate electrode 519 and the fourth electrode 524 of the storage capacitor 520 is disposed on the intermediate electrode 519 and the fourth electrode 524 of the storage capacitor 520. The second overcoating layer 515 may perform the same function as the overcoating layer 113 illustrated in FIG. 1. The intermediate electrode 519 may be formed of the same additional metal material as the fourth electrode 524 of the storage capacitor 520. In the organic light emitting display device 500 according to yet another embodiment of the present disclosure, a line resistance in a display area where a plurality of pixels is disposed can be reduced using the additional metal material. That is, lines configured to transfer the same signal may be formed as a multi-layer structure using the additional metal material. Therefore, the lines can be connected in parallel, so that the line resistance can be reduced.

Likewise, a line resistance of various lines disposed in a non-display area can also be reduced. The lines disposed in the non-display area are formed of the same material as various electrodes and lines disposed in the display area. Thus, the various lines disposed in the non-display area are limited in design, and there is a limit to reduction in line resistance of the lines. However, in the organic light emitting display device 500 according to yet another embodiment of the present disclosure, the additional metal material additionally used in the display area is also disposed in the non-display area. Thus, the various lines disposed in the non-display area may be formed as a multi-layer structure configured to transfer the same signal through a plurality of layers. Therefore, the line resistance can be reduced. Further, in the organic light emitting display device 500 according to yet another embodiment of the present disclosure, the additional metal material additionally used in the display area is also disposed in the non-display area. Thus, lines configured to transfer different signals may be disposed to be overlapped with each other. Therefore, the width of the non-display area can be reduced, so that the organic light emitting display device 500 with an improved narrow bezel can be provided.

In some embodiments, an additional passivation layer configured to protect the intermediate electrode 519 and the fourth electrode 524 of the storage capacitor 520 may be disposed on the first overcoating layer 513 so as to cover the intermediate electrode 519 and the fourth electrode 524 of the storage capacitor 520. In the organic light emitting display device 500 illustrated in FIG. 5, the two overcoating layers 513 and 515 are disposed continuously on the passivation layer 170. However, in some embodiments, a second passivation layer may be disposed instead of the first overcoating layer 513 illustrated in FIG. 5, so that two passivation layers may be disposed continuously.

Figure 6A:
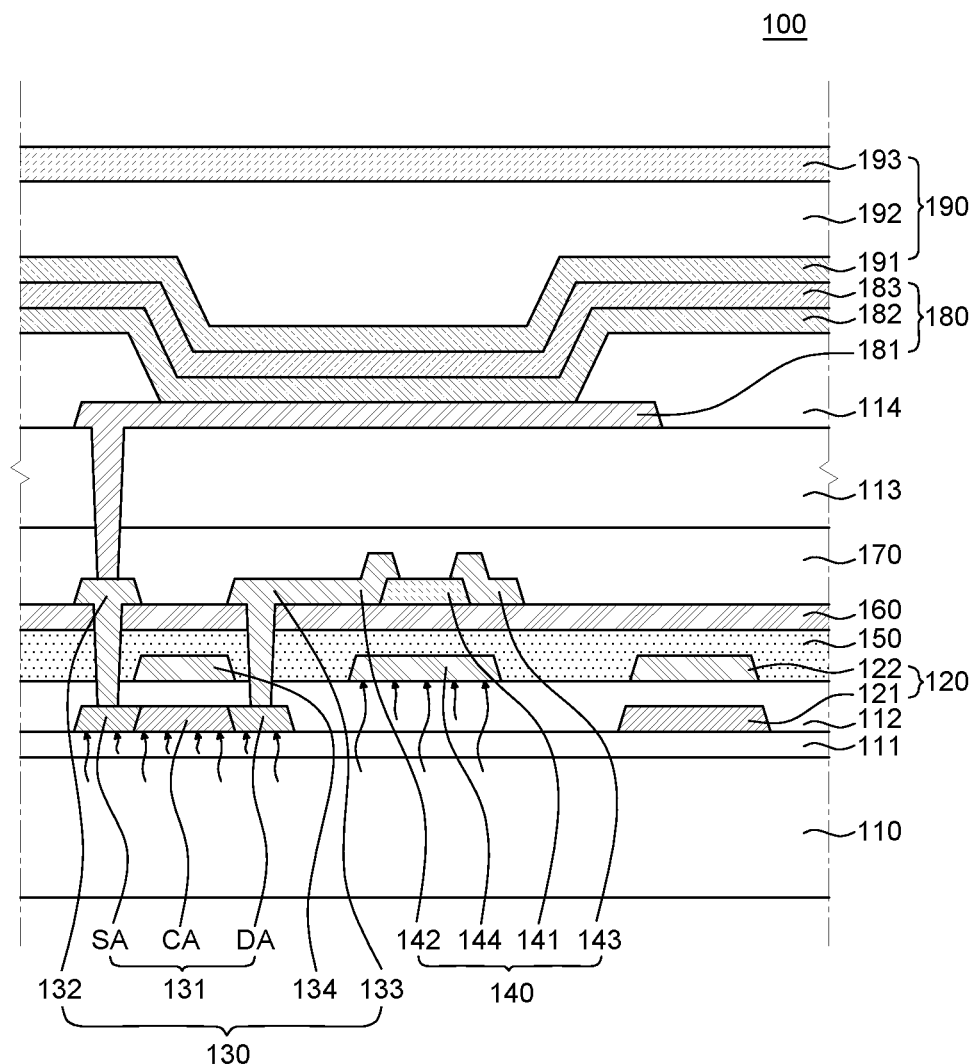
FIG. 6A is a cross-sectional view provided to explain an effect of a substrate and a buffer layer in an organic light emitting display device including a multi-type thin film transistor according to an embodiment of the present disclosure.

FIG. 6A is a cross-sectional view provided to explain an effect of a substrate and a buffer layer in an organic light emitting display device including a multi-type thin film transistor according to an embodiment of the present disclosure. The organic light emitting display device 100 illustrated in FIG. 6A is substantially the same as the organic light emitting display device 100 illustrated in FIG. 1. Therefore, redundant description thereof will be omitted.

As described above, the substrate 110 of the organic light emitting display device 100 may be formed of a plastic material such as polyimide (PI). The buffer layer 111 containing silicon nitride (SiNx) may be disposed on the substrate 110. Therefore, hydrogen or moisture from the substrate 110 or the buffer layer 111 may move upwards and affect the active layer 131 of the LTPS thin film transistor 130 and the active layer 141 of the oxide semiconductor thin film transistor 140.

Further, if the substrate 110 is formed of a plastic material, a supporting substrate for supporting the substrate 110 during the manufacturing process is bonded to a lower side of the substrate 110. In this case, a sacrificial layer is disposed between the substrate 110 and the supporting substrate. After the manufacturing process is completed, the substrate 110 and the supporting substrate may be separated through a laser release process. The active layer 131 of the LTPS thin film transistor 130 and the active layer 141 of the oxide semiconductor thin film transistor 140 formed on the substrate 110 may be damaged by a laser irradiated during the laser release process.

Further, due to a current drop caused by the substrate 110 and the sacrificial layer, the threshold voltage Vth of the LTPS thin film transistor 130 and the oxide semiconductor thin film transistor 140 may be changed. Specifically, a negative charge trap occurs in the sacrificial layer due to the laser and a light incident from the outside, and positive charges from the plastic material, e.g., polyimide (PI), in the substrate 110 move toward the sacrificial layer. Therefore, a potential on a surface of the substrate 110 is increased and the threshold voltage Vth of the LTPS thin film transistor 130 and the oxide semiconductor thin film transistor 140 may be shifted in a positive direction. Such a shift of the threshold voltage Vth decreases the reliability of the organic light emitting display device 100.

Referring to FIG. 6A, in the oxide semiconductor thin film transistor 140, the gate electrode 144 is disposed under the active layer 141. Therefore, the gate electrode 144 can block hydrogen or moisture described above and also block the laser irradiated during the laser release process. Further, a shift of the threshold voltage Vth of the oxide semiconductor thin film transistor which may occur when the potential on the surface of the substrate 110 is increased can also be suppressed. However, the active layer 131 of the LTPS thin film transistor 130 illustrated in FIG. 6A is exposed to all of the above-described dangers. Thus, the organic light emitting display device 100 according to various embodiments of the present disclosure may further include a bottom shield metal (BSM).

Figure 6B:
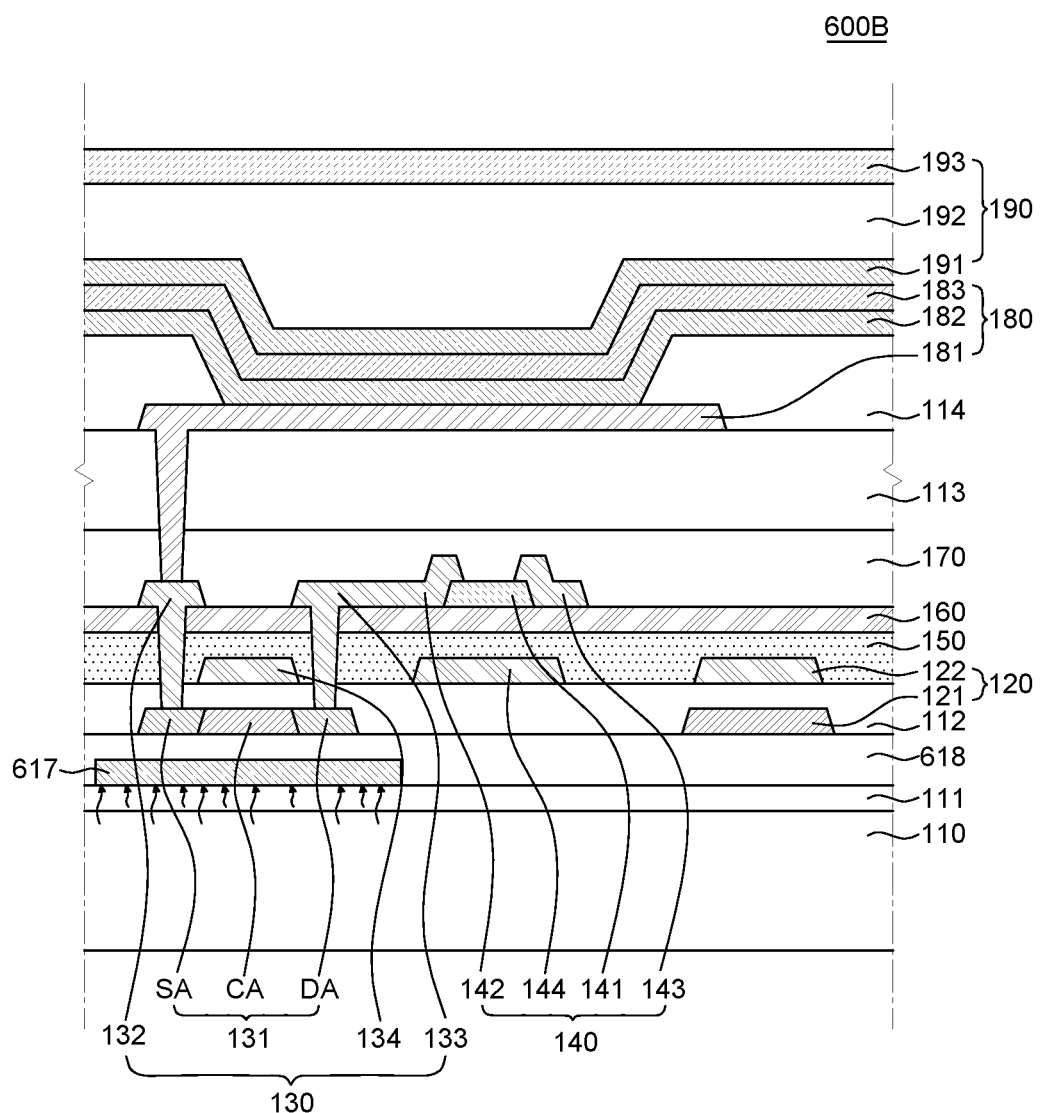
FIG. 6B and FIG. 6C are cross-sectional views of organic light emitting display devices each including a multi-type thin film transistor according to various embodiments of the present disclosure.
Figure 6C:
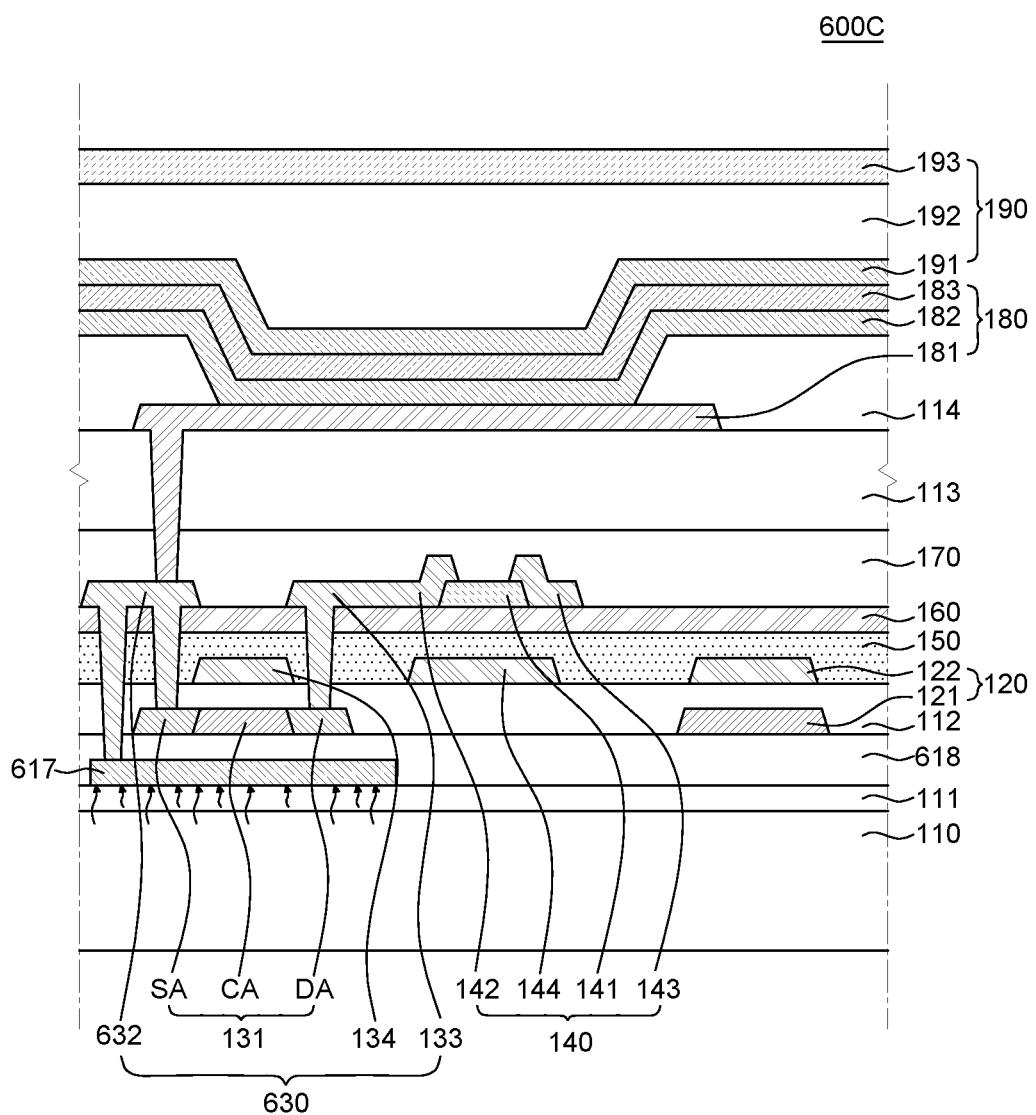

FIG. 6B and FIG. 6C are cross-sectional views of organic light emitting display devices each including a multi-type thin film transistor according to various embodiments of the present disclosure. An organic light emitting display device 600B illustrated in FIG. 6B is substantially the same as the organic light emitting display device 100 illustrated in FIG. 1 except that a BSM 617 and an active buffer 618 are further provided. Therefore, redundant description thereof will be omitted. An organic light emitting display device 600C illustrated in FIG. 6C is substantially the same as the organic light emitting display device 100 illustrated in FIG. 1 except that the BSM 617 and the active buffer 618 are further provided and the source electrode 132 of the LTPS thin film transistor 130 is connected to the BSM 617. Therefore, redundant description thereof will be omitted.

Referring to FIG. 6B, the BSM 617 is disposed on the buffer layer 111. The BSM 617 may be disposed on the buffer layer 111 so as to be overlapped with the active layer 131 of the LTPS thin film transistor 130. In a cross-sectional view, the BSM 617 may have a greater width than the active layer 131 of the LTPS thin film transistor 130. The BSM 617 may be formed of various metal materials. In the organic light emitting display device 600B illustrated in FIG. 6B, the BSM 617 may be floated, so that a voltage may not be applied to the BSM 617.

The active buffer 618 configured to insulate the BSM 617 from the active layer 131 of the LTPS thin film transistor 130 is disposed on the BSM 617. The active buffer 618 may be formed of the same material as the buffer layer 111. For example, the active buffer 618 may be formed as a single layer of silicon nitride (SiNx) or silicon oxide (SiOx) or a multi-layer including silicon nitride (SiNx) and silicon oxide (SiOx) laminated alternately.

Referring to FIG. 6C, the BSM 617 is disposed on the buffer layer 111 and the active buffer 618 is disposed on the BSM 617. Further, a source electrode 632 of an LTPS thin film transistor 630 is connected to the BSM 617 through a contact hole. Therefore, the same voltage is applied to the BSM 617 and the source electrode 632 of the LTPS thin film transistor 630. FIG. 6C illustrates that the BSM 617 is connected to the source electrode 632 of the LTPS thin film transistor 630. However, the BSM 617 may be connected to the gate electrode 134 of the LTPS thin film transistor 630 or the drain electrode 133 of the LTPS thin film transistor 630. Accordingly, the same voltage may be applied to the BSM 617 and the gate electrode 134 of the LTPS thin film transistor 630 or to the BSM 617 and the drain electrode 133 of the LTPS thin film transistor 630. Otherwise, a desired constant voltage may be applied to the BSM 617 through a separate line for applying a constant voltage.

In the organic light emitting display devices 600B and 600C according to various embodiments of the present disclosure, the BSM 617 floated as illustrated in FIG. 6B may be used or the BSM 617 configured to be applied with a specific voltage as illustrated in FIG. 6C may be further included. Thus, the laser irradiated during the laser release process and hydrogen or moisture can be blocked by the BSM 617. Also, a shift of the threshold voltage Vth of the LTPS thin film transistor 130 which may occur when the potential on the surface of the substrate 110 is increased can also be suppressed by the BSM 617.

Figure 7:
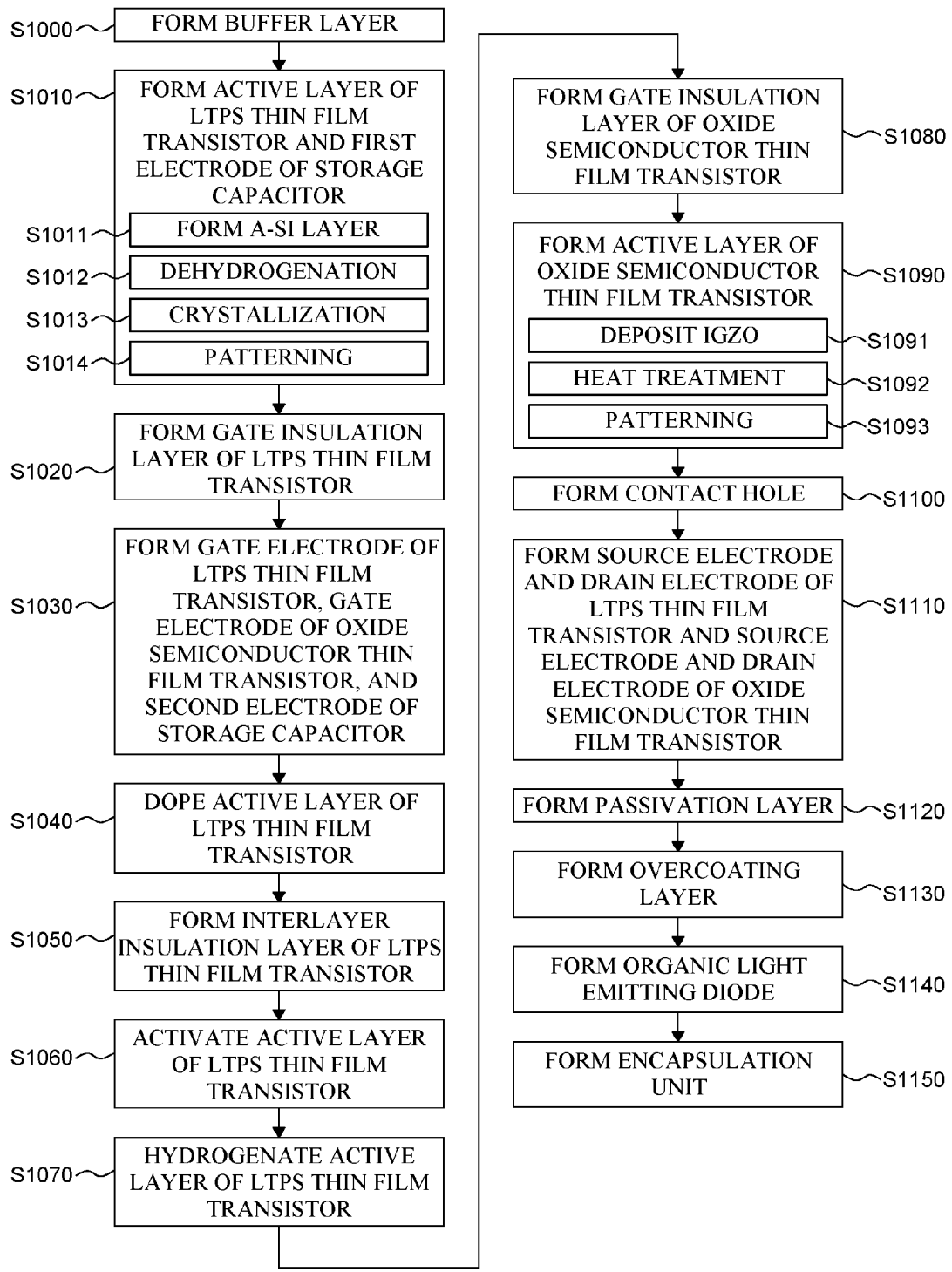
FIG. 7 is a schematic flowchart of a method of manufacturing an organic light emitting display device including a multi-type thin film transistor according to an embodiment of the present disclosure.

FIG. 7 is a schematic flowchart of a method of manufacturing an organic light emitting display device including a multi-type thin film transistor according to an embodiment of the present disclosure. FIG. 8A through FIG. 8I are process cross-sectional views of a method of manufacturing an organic light emitting display device including a multi-type thin film transistor according to an embodiment of the present disclosure. FIG. 7 and FIG. 8A through FIG. 8I are a flowchart and process cross-sectional view of a method of manufacturing the organic light emitting display device 100 illustrated in FIG. 1. Therefore, redundant description thereof will be omitted.

Firstly, the buffer layer 111 is formed on the substrate 110 (S1000).

Figure 8A:
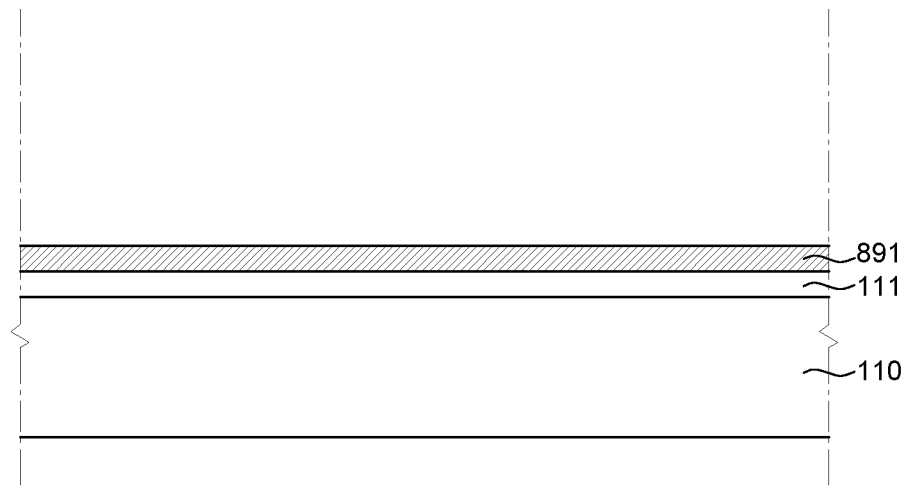
FIG. 8A through FIG. 8I are process cross-sectional views of a method of manufacturing an organic light emitting display device including a multi-type thin film transistor according to an embodiment of the present disclosure.

Referring to FIG. 8A, the buffer layer 111 is deposited on the surface of the substrate 110. Specifically, the buffer layer 111 may be formed as a single layer by depositing any one of silicon nitride (SiNx) or silicon oxide (SiOx) or as a multi-layer by alternately laminating silicon nitride (SiNx) and silicon oxide (SiOx). Otherwise, the buffer layer 111 may be formed as a multi-layer by selecting any one of silicon nitride (SiNx) or silicon oxide (SiOx) with different properties such as a density or the like.

Then, the active layer 131 of the LTPS thin film transistor 130 and the first electrode 121 of the storage capacitor 120 are formed on the buffer layer 111 (S1010).

Referring to FIG. 7 and FIG. 8A, an amorphous silicon (a-Si) layer 891 is formed on a surface of the buffer layer 111 by depositing an a-Si material thereon (S1011) and a dehydrogenation process (S1012) is performed to the a-Si layer 891. If a large amount of hydrogen is present in the a-Si layer 891, hydrogen in the a-Si layer 891 may explode during a crystallization process (S1013) as a subsequent process, which may cause a defect. Thus, the dehydrogenation process which is a process for removing hydrogen from the a-Si layer 891 is performed after the a-Si layer 891 is formed and before the crystallization process (S1013) is performed.

Then, after the dehydrogenation process (S1012) is completed, the crystallization process (S1013) is performed to the a-Si layer 891. The crystallization process is a process for crystallizing amorphous silicon (a-Si) in the a-Si layer 891 into poly-silicon. For example, the crystallization process may be performed through excimer laser annealing (ELA).

Figure 8B:
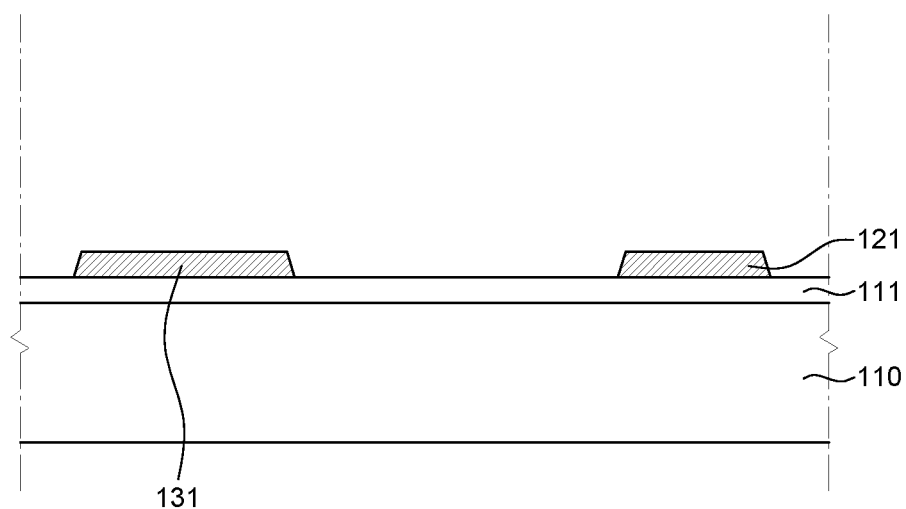

Then, referring to FIG. 7 and FIG. 8B, the crystallized a-Si layer 891 is patterned to form the active layer 131 of the LTPS thin film transistor 130 and the first electrode 121 of the storage capacitor 120 (S1014).

Then, the gate insulation layer 112 of the LTPS thin film transistor 130 is formed (S1020), and the gate electrode 134 of the LTPS thin film transistor 130, the gate electrode 144 of the oxide semiconductor thin film transistor 140, and the second electrode 122 of the storage capacitor 120 are formed (S1030).

Figure 8C:
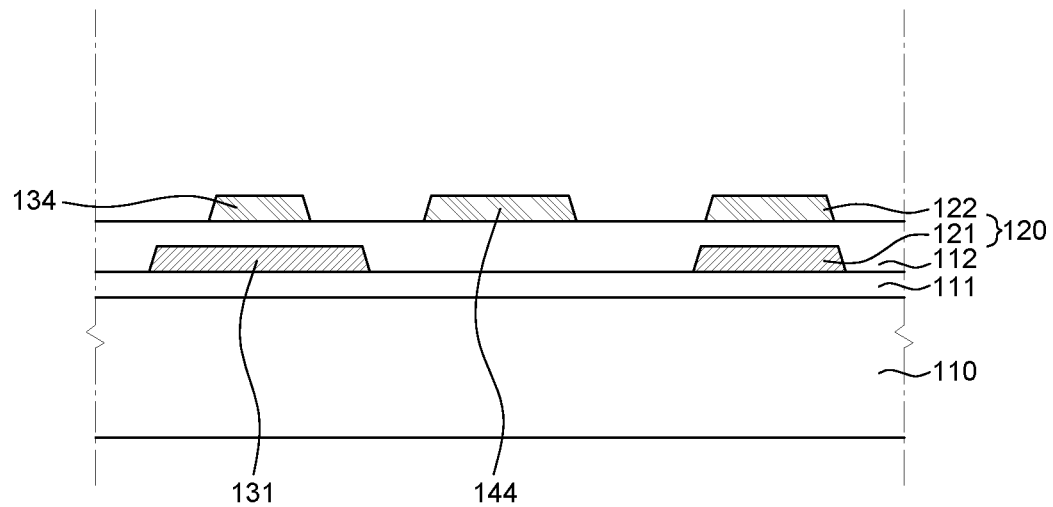

Referring to FIG. 8C, the gate insulation layer 112 of the LTPS thin film transistor 130 is formed on the active layer 131 of the LTPS thin film transistor 130 and the first electrode 121 of the storage capacitor 120. Specifically, the gate insulation layer 112 of the LTPS thin film transistor 130 may be formed as a single layer by depositing any one of silicon nitride (SiNx) or silicon oxide (SiOx) or as a multi-layer by alternately laminating silicon nitride (SiNx) and silicon oxide (SiOx). Otherwise, the gate insulation layer 112 may be formed as a multi-layer by selecting any one of silicon nitride (SiNx) or silicon oxide (SiOx) with different properties such as a density or the like.

Then, a gate electrode material is deposited on the gate insulation layer 112 of the LTPS thin film transistor 130 and then patterned to form the gate electrode 134 of the LTPS thin film transistor 130, the gate electrode 144 of the oxide semiconductor thin film transistor 140, and the second electrode 122 of the storage capacitor 120. The gate electrode material may include various metal materials such as molybdenum (Mo).

Then, a doping process is performed to the active layer 131 of the LTPS thin film transistor 130 using the gate electrode 134 of the LTPS thin film transistor 130 as a mask (S1040).

Figure 8D:
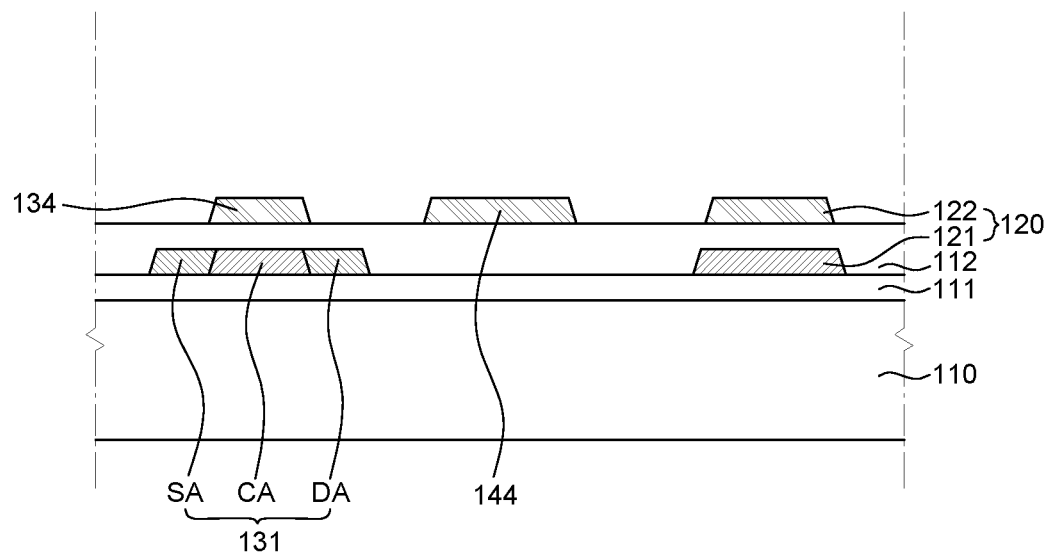

Referring to FIG. 8D, impurities are injected to the active layer 131 of the LTPS thin film transistor 130 disposed under the gate electrode 134 of the LTPS thin film transistor 130 using the gate electrode 134 of the LTPS thin film transistor 130 as a mask. Thus, the source area SA and the drain area DA, i.e., a doping area, of the LTPS thin film transistor 130 may be defined. The doping area may be defined in various ways depending on a P-MOS thin film transistor, an N-MOS thin film transistor, or a C-MOS thin film transistor. For example, in case of the N-MOS thin film transistor, a high-density doping area may be formed first and then, a low-density doping area may be formed. Specifically, the high-density doping area may be defined using a photoresist having a greater size than the gate electrode 134 of the LTPS thin film transistor 130. Then, the photoresist may be removed and the low-density doping area (LDD) may be defined using the gate electrode 134 of the LTPS thin film transistor 130 as a mask.

In some embodiments, the doping area including the source area SA and the drain area DA may be defined before the gate insulation layer 112 of the LTPS thin film transistor 130 is formed. That is, right after the active layer 131 of the LTPS thin film transistor 130 and the first electrode 121 of the storage capacitor 120 are formed, the impurities may also be doped using the photoresist. In this case, the first electrode 121 of the storage capacitor 120 may be doped with the impurities.

Then, the interlayer insulation layer 150 of the LTPS thin film transistor 130 is formed on the gate electrode 134 of the LTPS thin film transistor 130, the gate electrode 144 of the oxide semiconductor thin film transistor 140, and the second electrode 122 of the storage capacitor 120 (S1050).

Figure 8E:
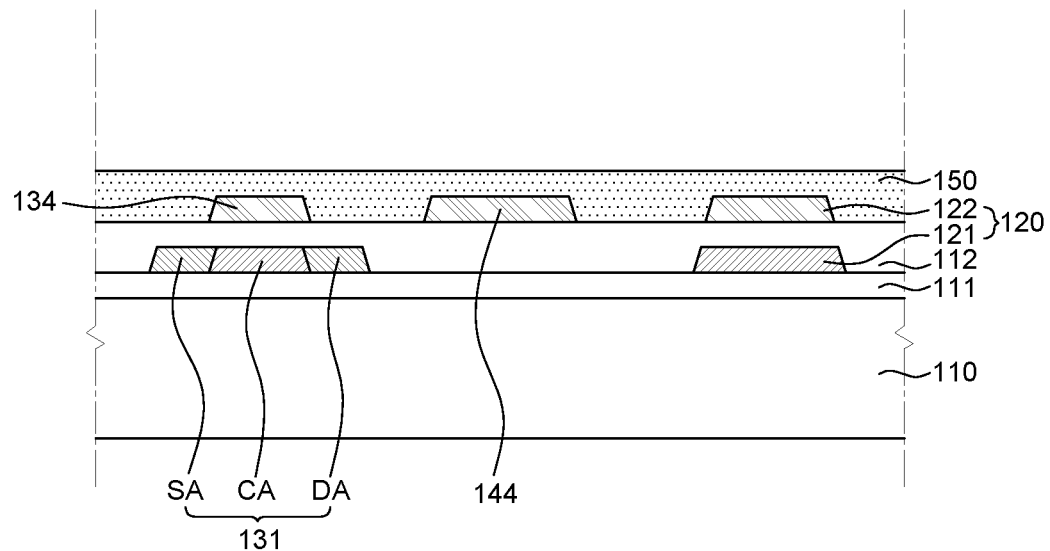

Referring to FIG. 8E, the interlayer insulation layer 150 of the LTPS thin film transistor 130 may be formed on the gate electrode 134 of the LTPS thin film transistor 130, the gate electrode 144 of the oxide semiconductor thin film transistor 140, and the second electrode 122 of the storage capacitor 120 by depositing silicon nitride (SiNx) thereon. The interlayer insulation layer 150 of the LTPS thin film transistor 130 may be formed of an inorganic film having a high hydrogen content to supply hydrogen to the active layer 131 of the LTPS thin film transistor 130 during a subsequent hydrogenation process of the active layer 131 of the LTPS thin film transistor 130.

Then, an activation process is performed to the active layer 131 of the LTPS thin film transistor 130 (S1060), and a hydrogenation process is performed to the active layer 131 of the LTPS thin film transistor 130 (S1070).

As illustrated in FIG. 8E, after the interlayer insulation layer 150 is formed of silicon nitride (SiNx), the activation process is performed to the active layer 131 of the LTPS thin film transistor 130 before the gate insulation layer 160 of the oxide semiconductor thin film transistor 140 is formed. After the activation process is performed, the hydrogenation process is performed to the active layer 131 of the LTPS thin film transistor 130. The hydrogenation process may be performed before and after the gate insulation layer 160 of the oxide semiconductor thin film transistor 140 is formed.

Regarding the activation process to the active layer 131 of the LTPS thin film transistor 130, impurities (dopant) injected as a result of the doping process to the active layer 131 of the LTPS thin film transistor 130 are randomly present. Thus, the activation process to the active layer 131 of the LTPS thin film transistor 130 is a process for positioning the impurities in a silicon (Si) lattice. Further, the doping process to the active layer 131 of the LTPS thin film transistor 130 is a process of artificially injecting the impurities into the active layer. Therefore, as a result of the doping process to the active layer 131 of the LTPS thin film transistor 130, the silicon (Si) may be damaged. Thus, the activation process may be performed to the active layer 131 of the LTPS thin film transistor 130 to cure the damage to the silicon (Si). For example, the activation process may be performed at a temperature of from about 480° C. to about 550° C. for about 120 seconds.

Regarding the hydrogenation process to the active layer 131 of the LTPS thin film transistor 130, if poly-silicon has vacancies, the properties thereof deteriorate. Thus, the hydrogenation process to the active layer 131 of the LTPS thin film transistor 130 is a process for filling the vacancies of the poly-silicon with hydrogen. The hydrogenation process to the active layer 131 of the LTPS thin film transistor 130 is performed by diffusing hydrogen contained in the interlayer insulation layer 150 of the LTPS thin film transistor 130 through a heat treatment. For example, the hydrogenation process may be performed at a temperature of from about 350° C. to about 420° C. for about 3000 seconds. The hydrogenation process to the active layer 131 of the LTPS thin film transistor 130 may stabilize the active layer 131 of the LTPS thin film transistor 130.

Then, the gate insulation layer 160 of the oxide semiconductor thin film transistor 140 is formed on the interlayer insulation layer 150 of the LTPS thin film transistor 130 (S1080). Then, the active layer 141 of the oxide semiconductor thin film transistor 140 is formed on the gate insulation layer 160 of the oxide semiconductor thin film transistor 140 (S1090). Otherwise, the hydrogenation process to the LTPS thin film transistor 130 may be performed after the interlayer insulation layer 150 of the LTPS thin film transistor 130 is formed.

Figure 8F:
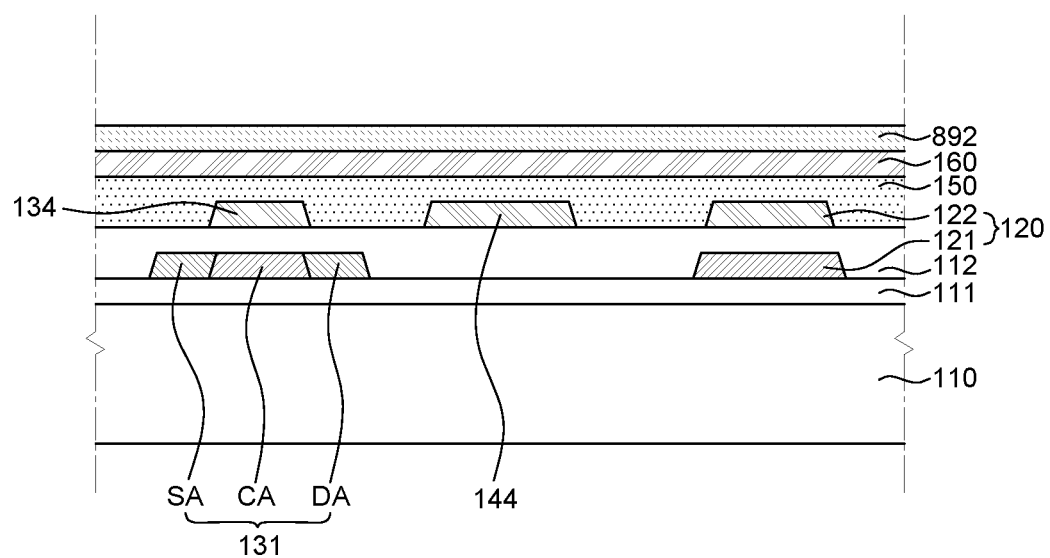

Referring to FIG. 8F, the gate insulation layer 160 of the oxide semiconductor thin film transistor 140 may be formed on the interlayer insulation layer 150 of the LTPS thin film transistor 130. The gate insulation layer 160 of the oxide semiconductor thin film transistor 140 may be formed of silicon oxide (SiOx) to suppress diffusion of hydrogen from the interlayer insulation layer 150 of the LTPS thin film transistor 130 into the active layer 141 of the oxide semiconductor thin film transistor 140.

Then, a metal oxide, e.g., indium-gallium-zinc oxide (hereinafter, referred to as "IGZO"), is deposited (S1091) on the gate insulation layer 160 of the oxide semiconductor thin film transistor 140 to form an IGZO layer 892. FIG. 8F illustrates that the IGZO layer 892 is formed assuming that the active layer 141 of the oxide semiconductor thin film transistor 140 is formed of IGZO from among various metal oxides. However, the present disclosure is not limited thereto. Instead of IGZO, another metal oxide may also be used.

The deposition of IGZO is performed at a high temperature. Therefore, IGZO may be crystallized during the deposition of IGZO. If IGZO is deposited at room temperature, IGZO may be in an amorphous state. However, if IGZO is deposited at a high temperature, indium (In), gallium (Ga), and zinc (Zn) have a layer structure and form a network. Further, as IGZO is crystallized at a high temperature, oxygen vacancies within the IGZO layer 892 are decreased. If there are a lot of oxygen vacancies within the IGZO layer 892, tunneling occurs, so that the IGZO layer 892 may become conductive. Therefore, when IGZO is deposited, crystallization is performed at a high temperature. Accordingly, the BTS of the oxide semiconductor thin film transistor 140 can be improved and the reliability can be increased.

Figure 8G:
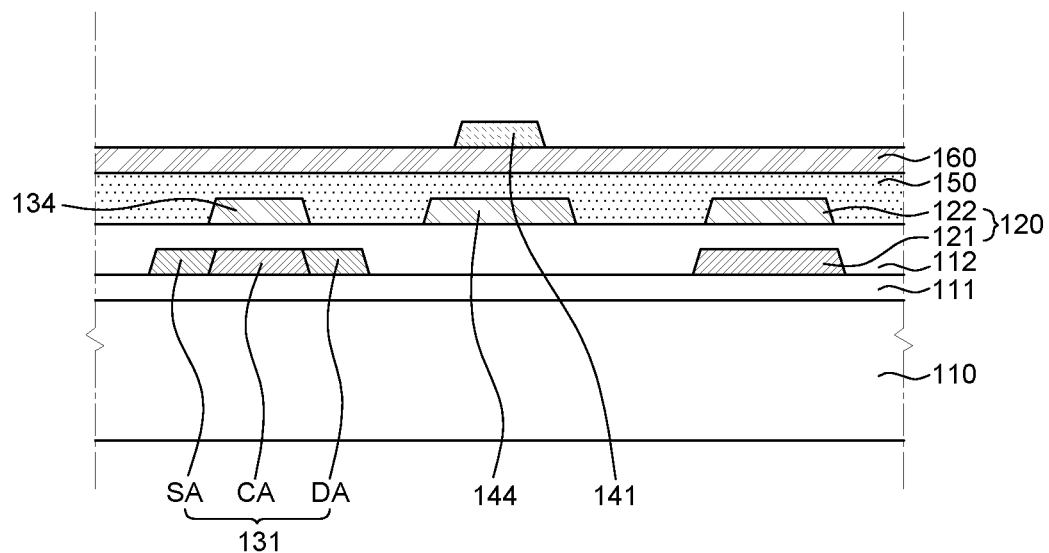

Then, a heat treatment is performed to the IGZO layer 892 to stabilize the IGZO layer 892 (S1092). Then, as illustrated in FIG. 8G, the IGZO layer 892 is patterned (S1093) to form the active layer 141 of the oxide semiconductor thin film transistor 140.

Figure 8H:
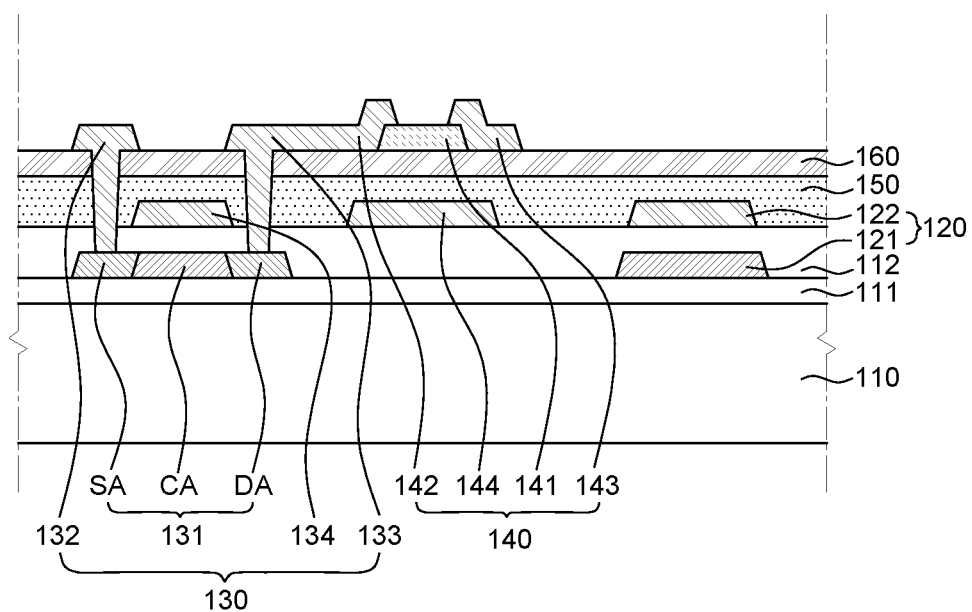

Then, as illustrated in FIG. 8H, contact holes are formed in the gate insulation layer 112 and the interlayer insulation layer 150 of the LTPS thin film transistor 130 and the gate insulation layer 160 of the oxide semiconductor thin film transistor 140 (S1100). Then, the source electrode 132 and the drain electrode 133 of the LTPS thin film transistor 130 and the source electrode 142 and the drain electrode 143 of the oxide semiconductor thin film transistor 140 are formed (S1110).

After the contact holes are formed in the gate insulation layer 112 and the interlayer insulation layer 150 of the LTPS thin film transistor 130 and the gate insulation layer 160 of the oxide semiconductor thin film transistor 140, the source electrode 132 and the drain electrode 133 of the LTPS thin film transistor 130 and the source electrode 142 and the drain electrode 143 of the oxide semiconductor thin film transistor 140 may be formed by depositing and patterning a source electrode material and a drain electrode material on the gate insulation layer 160 and the active layer of the oxide semiconductor thin film transistor 140. The source electrode 132 and the drain electrode 133 of the LTPS thin film transistor 130 and the source electrode 142 and the drain electrode 143 of the oxide semiconductor thin film transistor 140 may be formed as a three-layer structure including titanium (Ti)/aluminum (Al)/titanium (Ti). In this case, a patterning process may be performed through dry etching.

In some embodiments, dry etching may be performed in two steps to suppress damage to the active layer 141 of the oxide semiconductor thin film transistor 140. For example, primary dry etching may be performed at a high etching rate and secondary dry etching may be performed at a low etching rate. By performing the dry etching in two steps as such, damage to the active layer 141 of the oxide semiconductor thin film transistor 140 can be reduced.

Figure 8I:
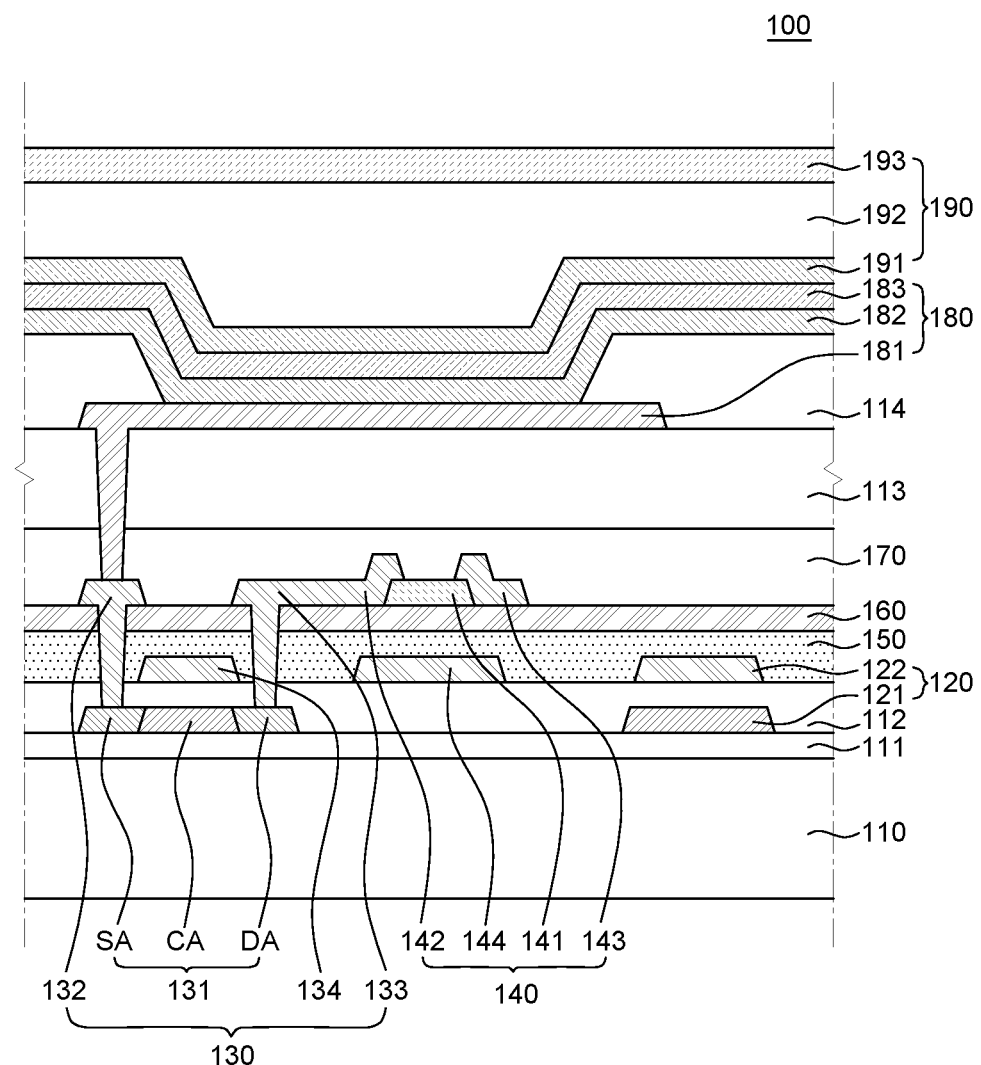

Then, as illustrated in FIG. 8I, the passivation layer 170 is formed to cover the LTPS thin film transistor 130 and the oxide semiconductor thin film transistor 140 (S1120). The overcoating layer 113 is formed on the passivation layer 170 (S1130) and the organic light emitting element 180 is formed on the overcoating layer 113 (S1140). Then, the encapsulation unit 190 is formed on the organic light emitting element 180 (S1150). The passivation layer 170 may be formed as a double-layer structure as described above.

Figure 9:
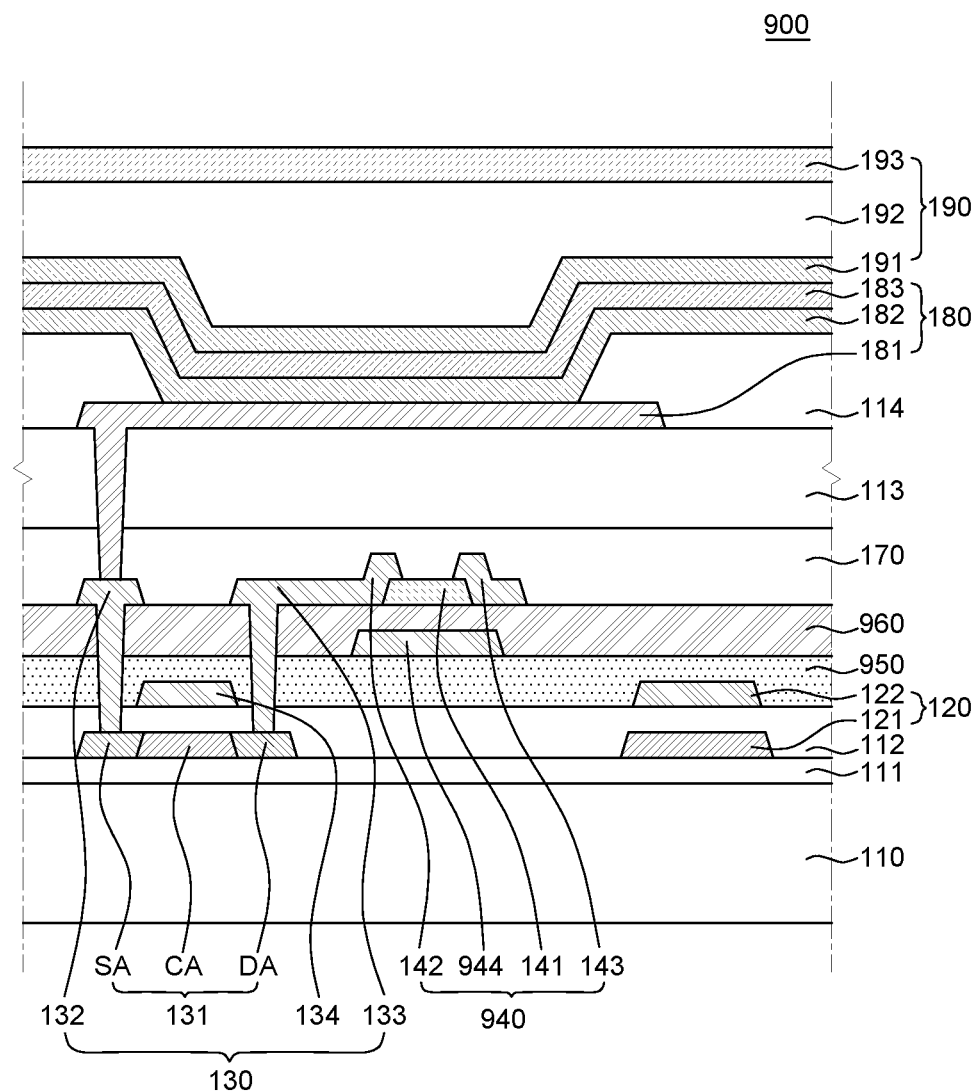
FIG. 9 is a cross-sectional view of an organic light emitting display device including a multi-type thin film transistor according to still another embodiment of the present disclosure.

FIG. 9 is a cross-sectional view of an organic light emitting display device including a multi-type thin film transistor according to still another embodiment of the present disclosure. An organic light emitting display device 900 illustrated in FIG. 9 is substantially the same as the organic light emitting display device 100 illustrated in FIG. 1 except that a gate electrode 944 of an oxide semiconductor thin film transistor 940 is changed in position, and an interlayer insulation layer 950 of the LTPS thin film transistor 130 and a gate insulation layer 960 of the oxide semiconductor thin film transistor 940 are modified. Therefore, redundant description thereof will be omitted.

Referring to FIG. 9, the interlayer insulation layer 950 of the LTPS thin film transistor 130 is disposed on the gate electrode 134 of the LTPS thin film transistor 130. The interlayer insulation layer 950 may be formed as a single layer or may be formed as two or more layers having different properties from each other. For example, the interlayer insulation layer 950 may be formed as a single layer of silicon nitride (SiNx) or a multi-layer including at least one layer formed of silicon nitride (SiNx).

The gate electrode 944 of the oxide semiconductor thin film transistor 940 is disposed on the interlayer insulation layer 950 of the LTPS thin film transistor 130. The gate electrode 944 of the oxide semiconductor thin film transistor 940 is formed of a metal material. For example, the gate electrode 944 may be formed of the same material as the gate electrode 134 of the LTPS thin film transistor 130.

The gate insulation layer 960 of the oxide semiconductor thin film transistor 940 formed of silicon oxide (SiOx) is disposed on the gate electrode 944 of the oxide semiconductor thin film transistor 940. Further, the active layer 141 of the oxide semiconductor thin film transistor 940 is disposed on the gate insulation layer 960 of the oxide semiconductor thin film transistor 940.

In the organic light emitting display device 900 according to still another exemplary embodiment of the present disclosure, only the gate insulation layer 960 formed as a single layer is disposed between the active layer 141 and the gate electrode 944 of the oxide semiconductor thin film transistor 940. That is, in the organic light emitting display device 900 according to still another embodiment of the present disclosure, the gate insulation layer 960 of the oxide semiconductor thin film transistor 940 can be tuned independently. Thus, the properties of the oxide semiconductor thin film transistor 940 can be individually controlled regardless of the other components. More specifically, an on-current of the oxide semiconductor thin film transistor 940 is affected by a distance between the active layer 141 and the gate electrode of the oxide semiconductor thin film transistor 940. Meanwhile, if any layer other than the gate insulation layer 960 of the oxide semiconductor thin film transistor 940 is additionally disposed between the active layer 141 and the gate electrode of the oxide semiconductor thin film transistor 940, there may be a change in the on-current of the oxide semiconductor thin film transistor 940. In this case, there is a limit to the control of distance between the active layer 141 and the gate electrode of the oxide semiconductor thin film transistor 940 to improve only the on-current of the oxide semiconductor thin film transistor 940. However, in the organic light emitting display device 900 according to still another embodiment of the present disclosure, only the gate insulation layer 960 is disposed between the active layer 141 and the gate electrode of the oxide semiconductor thin film transistor 940. Therefore, it is possible to independently control the distance between the active layer 141 and the gate electrode of the oxide semiconductor thin film transistor 940 and thus possible to reduce the distance between the active layer 141 and the gate electrode of the oxide semiconductor thin film transistor 940. Therefore, the on-current of the oxide semiconductor thin film transistor 940 can be improved. Further, since the gate insulation layer 960 of the oxide semiconductor thin film transistor 940 is separately used, the degree of freedom in design can also be increased.

In the organic light emitting display device 900 illustrated in FIG. 9, the storage capacitor 120 includes the first electrode 121 and the second electrode 122, but is not limited thereto. The storage capacitor 120 may further include a third electrode or a fourth electrode. For example, a third electrode of the storage capacitor 120 may be disposed on the interlayer insulation layer 950 of the LTPS thin film transistor 130. In this case, the third electrode may be formed of the same material through the same process as the gate electrode 944 of the oxide semiconductor thin film transistor 940. Further, a fourth electrode of the storage capacitor 120 may be disposed on the gate insulation layer 960 of the oxide semiconductor thin film transistor 940. In this case, the fourth electrode may be formed of the same material through the same process as the source electrode 142 and the drain electrode 143 of the oxide semiconductor thin film transistor 940. As such, since the third electrode or the fourth electrode of the storage capacitor 120 is further disposed, a capacitance value of the storage capacitor 120 can be increased. Further, the storage capacitor 120 can be formed during a manufacturing process of the LTPS thin film transistor 130 or the oxide semiconductor thin film transistor 940 without any additional processes, which is efficient in terms of the processing costs and the processing time.

Further, the structures of the above-described organic light emitting display devices 100, 400, 500, 600B, and 600C can be applied to the organic light emitting display device 900 illustrated in FIG. 9. For example, the plurality of overcoating layers 513 and 515 and the additional metal layers 519, 524, and 523 of the organic light emitting display device 500 illustrated in FIG. 5 can be applied to the organic light emitting display device 900. Otherwise, the BSM 617 of the organic light emitting display devices 600B and 600C illustrated in FIG. 6B and FIG. 6C can also be applied thereto.

FIG. 7 illustrates that in the method of manufacturing an organic light emitting display device including a multi-type thin film transistor according to an embodiment of the present disclosure, the activation process and the hydrogenation process to the active layer 131 of the LTPS thin film transistor 130 and the heat treatment to the active layer 141 of the oxide semiconductor thin film transistor 140 are separately performed. However, the activation process and the hydrogenation process to the active layer 131 of the LTPS thin film transistor 130 and the heat treatment to the active layer 141 of the oxide semiconductor thin film transistor 140 may be performed at the same process. That is, by controlling a processing temperature in the heat treatment to the active layer 141 of the oxide semiconductor thin film transistor 140, the activation process and the hydrogenation process to the active layer 131 of the LTPS thin film transistor 130 may be performed together with the heat treatment to the active layer 141 of the oxide semiconductor thin film transistor 140. If the processes are performed as such, an effect of hydrogen on the active layer 141 of the oxide semiconductor thin film transistor 140 may be increased, but a plurality of processes can be integrated into a single process. Thus, the manufacturing process can be more simplified.

As described above, if the activation process and the hydrogenation process to the active layer 131 of the LTPS thin film transistor 130 and the heat treatment to the active layer 141 of the oxide semiconductor thin film transistor 140 are separately performed, the activation process and the hydrogenation process to the active layer 131 of the LTPS thin film transistor 130 need to be performed before the active layer 141 of the oxide semiconductor thin film transistor 140 is formed. In this case, after the interlayer insulation layer 150 of the LTPS thin film transistor 130 is formed and only the activation process is performed to the active layer 131 of the LTPS thin film transistor 130, the gate insulation layer 160 of the oxide semiconductor thin film transistor 140 may be formed. Then, the hydrogenation process may be performed to the active layer 131 of the LTPS thin film transistor 130 (Example 1). Otherwise, after the interlayer insulation layer 150 of the LTPS thin film transistor 130 is formed and all of the activation process and the hydrogenation process are performed to the active layer 131 of the LTPS thin film transistor 130, the gate insulation layer 160 of the oxide semiconductor thin film transistor 140 may be formed (Example 2). Alternatively, after all of the interlayer insulation layer 150 of the LTPS thin film transistor 130 and the gate insulation layer 160 of the oxide semiconductor thin film transistor 140 are formed, the activation process and the hydrogenation process may be performed to the active layer 131 of the LTPS thin film transistor 130 (Comparative Example). In the method of manufacturing an organic light emitting display device according to an embodiment of the present disclosure, the activation process is performed to the active layer 131 of the LTPS thin film transistor 130 before the gate insulation layer 160 of the oxide semiconductor thin film transistor 140 is formed. Thus, an effect of hydrogen on the active layer 141 of the oxide semiconductor thin film transistor 140 can be minimized. A more detailed explanation will be provided with reference to FIG. 10A through FIG. 10C and FIG. 11.

Figure 10A:
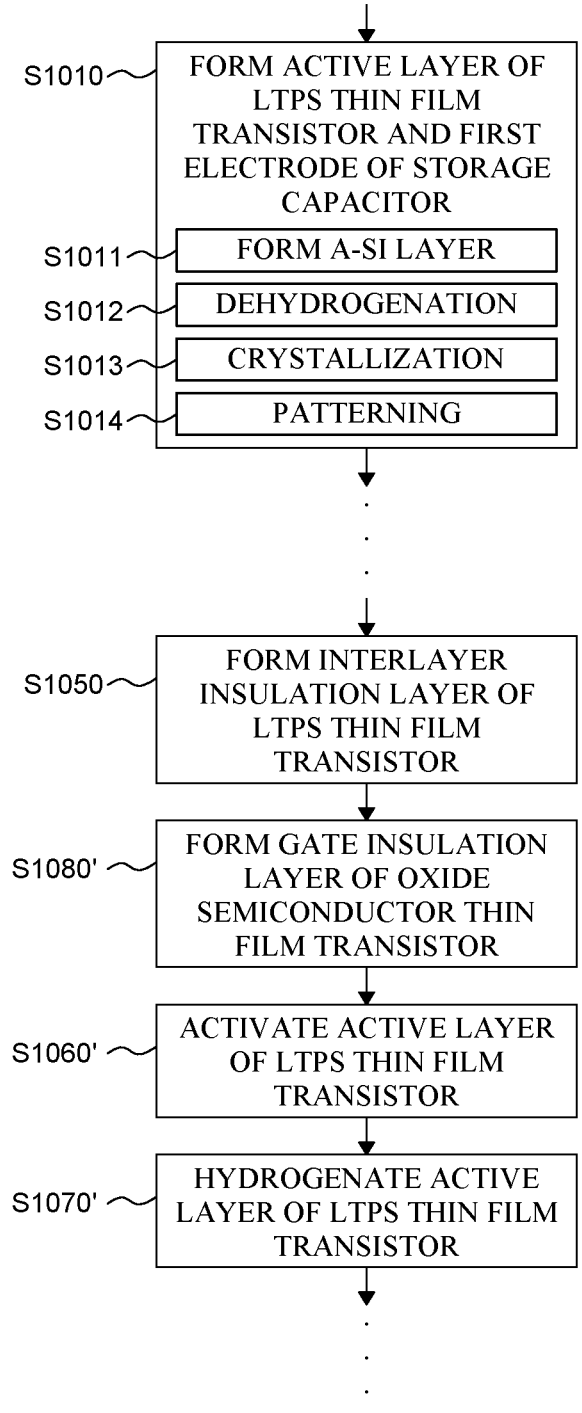
FIG. 10A is a schematic flowchart of an activation process and a hydrogenation process of an LTPS thin film transistor in a method of manufacturing an organic light emitting display device including a multi-type thin film transistor according to a Comparative Example.
Figure 10B:
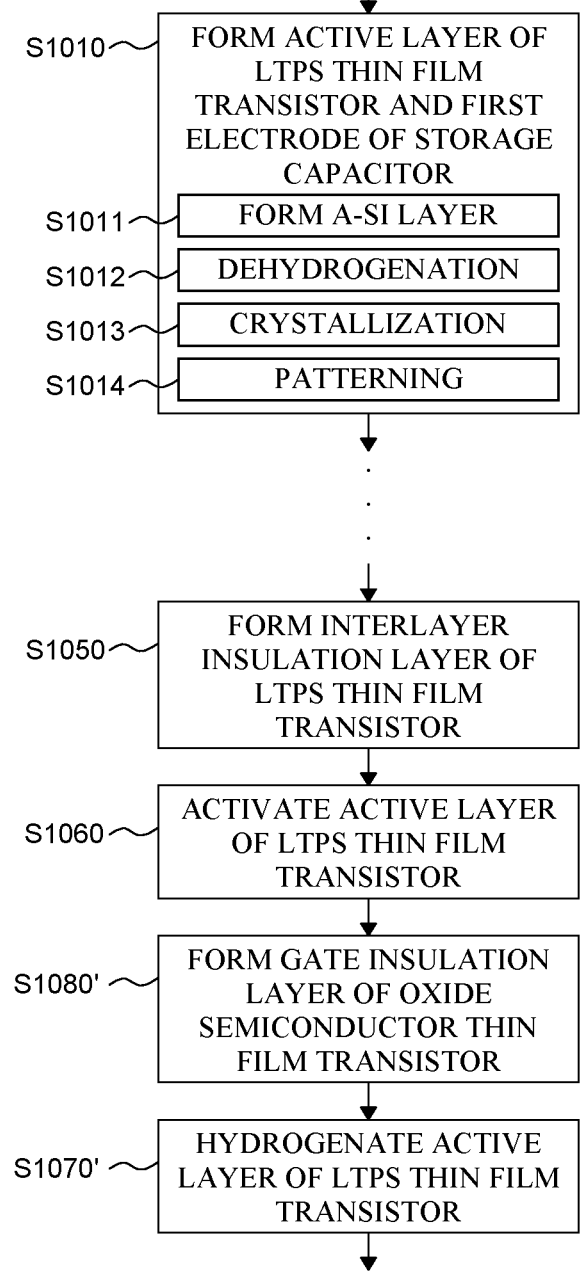
FIG. 10B and FIG. 10C are schematic flowcharts of an activation process and a hydrogenation process of an LTPS thin film transistor in a method of manufacturing an organic light emitting display device including a multi-type thin film transistor according to an embodiment and another embodiment of the present disclosure.
Figure 10C:
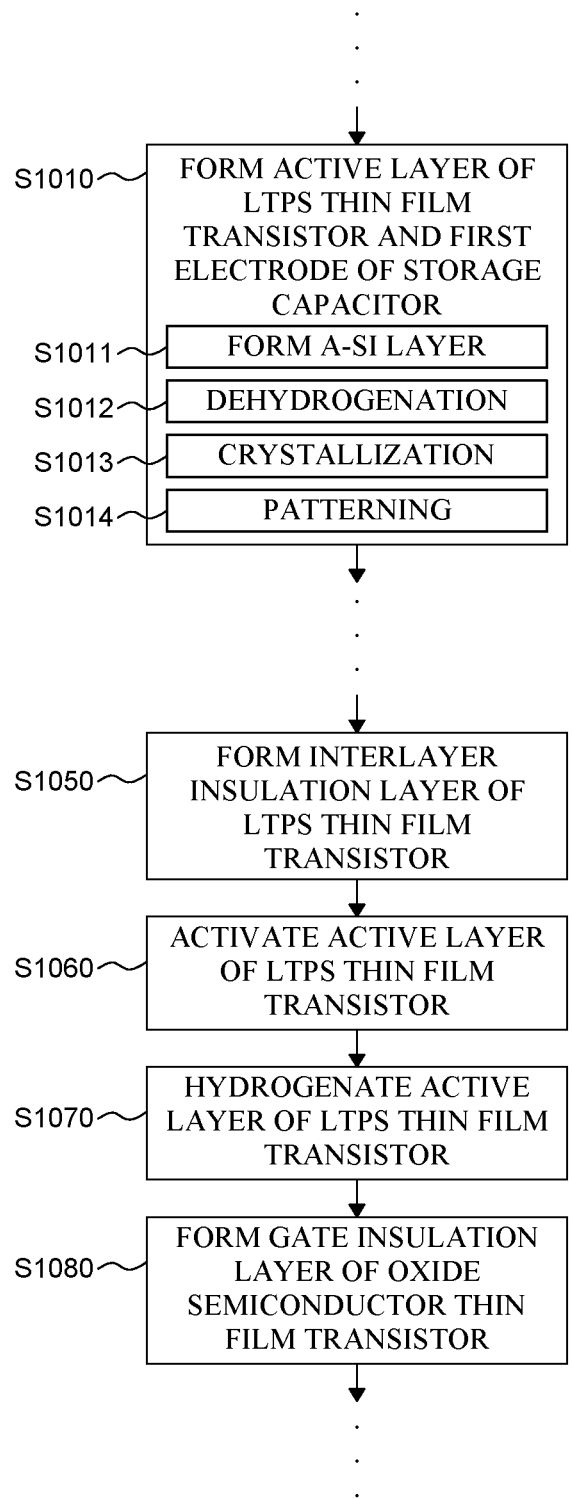
Figure 11:
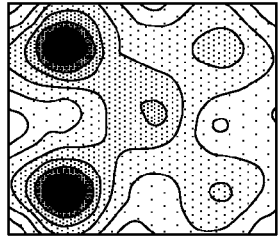
FIG. 11 is a table of Vth MAP and Vth variation caused by an activation process and a hydrogenation process of an LTPS thin film transistor in a method of manufacturing an organic light emitting display device including a multi-type thin film transistor according to an embodiment of the present disclosure and the Comparative Example.
Figure 11:
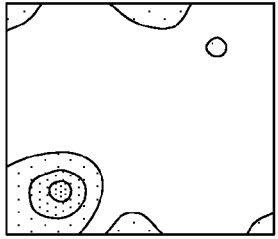
Figure 11:
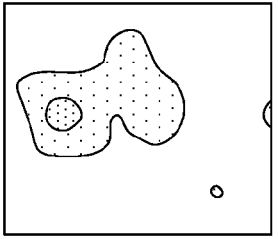

FIG. 10A is a schematic flowchart of an activation process and a hydrogenation process of an LTPS thin film transistor in a method of manufacturing an organic light emitting display device including a multi-type thin film transistor according to Comparative Example. FIG. 10B and FIG. 10C are schematic flowcharts of an activation process and a hydrogenation process of an LTPS thin film transistor in a method of manufacturing an organic light emitting display device including a multi-type thin film transistor according to an embodiment and another embodiment of the present disclosure. FIG. 11 is a table provided to explain Vth MAP and Vth variation caused by an activation process and a hydrogenation process of an LTPS thin film transistor in a method of manufacturing an organic light emitting display device including a multi-type thin film transistor according to an embodiment of the present disclosure and Comparative Example.

FIG. 10A is a flowchart of Comparative Example described above. FIG. 10B is a flowchart of Example 1 described above. FIG. 10C is a flowchart of Example 2 of the present disclosure. FIG. 11 shows Vth MAPS and Vth variation ranges of samples of Comparative Example, Example 1, and Example 2 after organic light emitting display devices each including a multi-type thin film transistor are manufactured by the processes according to Comparative Example, Example 1, and Example 2 illustrated in FIG. 10A through FIG. 10C, respectively. Herein, the Vth MAP is a diagram showing a difference in threshold voltage Vth in an active layer of an oxide semiconductor thin film transistor. In a specific area of the Vth Map, a threshold voltage Vth is low at a high hatching density, i.e., point density. Further, the Vth variation range shows the highest threshold voltage (Vth) value and the lowest threshold voltage (Vth) value in the Vth MAP. In each of Comparative Example, Example 1, and Example 2, an oxide semiconductor thin film transistor was manufactured such that a channel area of the oxide semiconductor thin film transistor has a width of 6 μm and a length of 6 μm. In this case, the samples are 20 oxide semiconductor thin film transistors formed on a single mother substrate.

Referring to FIG. 10A, in Comparative Example, the interlayer insulation layer 150 of the LTPS thin film transistor 130 is formed (S1050), the gate insulation layer 160 of the oxide semiconductor thin film transistor 140 is formed (S1080'), and an activation process (S1060') and a hydrogenation process (S1070') are performed to the active layer 131 of the LTPS thin film transistor 130. That is, in a state where the gate insulation layer 160 of the oxide semiconductor thin film transistor 140 formed of silicon oxide (SiOx) is disposed on the interlayer insulation layer 150 of the LTPS thin film transistor 130 formed of silicon nitride (SiNx), the activation process and the hydrogenation process are performed in series to the active layer 131 of the LTPS thin film transistor 130. Thus, while the activation process and the hydrogenation process are performed to the active layer 131 of the LTPS thin film transistor 130, hydrogen contained in the interlayer insulation layer 150 of the LTPS thin film transistor 130 is diffused into the gate insulation layer 160 of the oxide semiconductor thin film transistor 140. Thus, a large amount of hydrogen is included in the gate insulation layer 160 of the oxide semiconductor thin film transistor 140. Therefore, while the active layer 141 of the oxide semiconductor thin film transistor 140 is formed later and a heat treatment is performed to the active layer 141 of the oxide semiconductor thin film transistor 140, the large amount of hydrogen contained in the gate insulation layer 160 of the oxide semiconductor thin film transistor 140 may be diffused into the active layer 141 of the oxide semiconductor thin film transistor 140. Thus, the threshold voltage Vth of the oxide semiconductor thin film transistor 140 may be changed. Therefore, referring to FIG. 11, the Vth variation in the Comparative Example is as high as 4.2 V.

Referring to FIG. 10B, in Example 1, the interlayer insulation layer 150 of the LTPS thin film transistor 130 is formed (S1050), an activation process is performed to the active layer 131 of the LTPS thin film transistor 130 (S1060), the gate insulation layer 160 of the oxide semiconductor thin film transistor 140 is formed (S1080'), and a hydrogenation process is performed to the active layer 131 of the LTPS thin film transistor 130 (S1070'). That is, in a state where the interlayer insulation layer 150 of the LTPS thin film transistor 130 formed of silicon nitride (SiNx) is disposed, the activation process is performed to the active layer 131 of the LTPS thin film transistor 130. Then, in a state where the gate insulation layer 160 of the oxide semiconductor thin film transistor 140 formed of silicon oxide (SiOx) is disposed, the hydrogenation process is performed to the active layer 131 of the LTPS thin film transistor 130. Thus, during the activation process to the active layer 131 of the LTPS thin film transistor 130, the gate insulation layer 160 of the oxide semiconductor thin film transistor 140 is not present on the interlayer insulation layer 150 of the LTPS thin film transistor 130. Therefore, hydrogen is not diffused from the interlayer insulation layer 150 of the LTPS thin film transistor 130 into an upper layer. However, in a state where the gate insulation layer 160 of the oxide semiconductor thin film transistor 140 is disposed, the hydrogenation process is performed to the active layer 131 of the LTPS thin film transistor 130. Thus, during the hydrogenation process to the active layer 131 of the LTPS thin film transistor 130, hydrogen may be diffused from the interlayer insulation layer 150 of the LTPS thin film transistor 130 into the gate insulation layer 160 of the oxide semiconductor thin film transistor 140. However, the activation process performed at a higher processing temperature than the hydrogenation process may be performed before the gate insulation layer 160 of the oxide semiconductor thin film transistor 140 is formed, so that diffusion of hydrogen into the gate insulation layer 160 of the oxide semiconductor thin film transistor 140 can be minimized. Further, as described above, referring to FIG. 8B, the gate insulation layer 160 of the oxide semiconductor thin film transistor 140 may be formed as a multi-layer with a difference in density. For example, the gate insulation layer 160 of the oxide semiconductor thin film transistor 140 may include a first gate insulation layer 861 and a second gate insulation layer 862 formed of silicon oxide (SiOx). In this case, a film density of the second gate insulation layer 862 disposed in contact with the active layer 141 of the oxide semiconductor thin film transistor 140 may be higher than that of the first gate insulation layer 861. Therefore, while the active layer 141 of the oxide semiconductor thin film transistor 140 is formed later and a heat treatment is performed, the second gate insulation layer 862 having a higher film density can minimize diffusion of hydrogen into the active layer 141 of the oxide semiconductor thin film transistor 140. Referring to FIG. 11, it can be seen that the Vth variation of Example 1 is much lower than that of Comparative Example.

Referring to FIG. 10C, in Example 2, the interlayer insulation layer 150 of the LTPS thin film transistor 130 is formed (S1050), an activation process (S1060) and a hydrogenation process (S1070) are performed to the active layer 131 of the LTPS thin film transistor 130, and the gate insulation layer 160 of the oxide semiconductor thin film transistor 140 is formed (S1080). That is, in a state where the interlayer insulation layer 150 of the LTPS thin film transistor 130 formed of silicon nitride (SiNx) is disposed, all of the activation process and the hydrogenation process are performed to the active layer 131 of the LTPS thin film transistor 130. Then, the gate insulation layer 160 of the oxide semiconductor thin film transistor 140 formed of silicon oxide (SiOx) is disposed. Thus, during the activation process and the hydrogenation process to the active layer 131 of the LTPS thin film transistor 130, any layer is not present on the interlayer insulation layer 150 of the LTPS thin film transistor 130. Therefore, hydrogen is not diffused from the interlayer insulation layer 150 of the LTPS thin film transistor 130 into an upper layer. Further, during the activation process and the hydrogenation process to the active layer 131 of the LTPS thin film transistor 130, hydrogen contained in a surface of the interlayer insulation layer 150 of the LTPS thin film transistor 130 in contact with the gate insulation layer 160 of the oxide semiconductor thin film transistor 140 may be removed. Therefore, hydrogen is not diffused from the interlayer insulation layer 150 of the LTPS thin film transistor 130 into the gate insulation layer 160 of the oxide semiconductor thin film transistor 140 formed later. Therefore, while the active layer 141 of the oxide semiconductor thin film transistor 140 is formed later and a heat treatment is performed, the amount of hydrogen diffused from the gate insulation layer 160 of the oxide semiconductor thin film transistor 140 and the interlayer insulation layer 150 of the LTPS thin film transistor 130 is remarkably reduced. Referring to FIG. 11, it can be seen that the Vth variation of Example 2 is much lower than that of Comparative Example.

Although the exemplary embodiments of the present disclosure have been described in detail with reference to the accompanying drawings, the present disclosure is not limited thereto and may be embodied in many different forms without departing from the technical concept of the present disclosure. Therefore, the exemplary embodiments of the present disclosure are provided for illustrative purposes only but not intended to limit the technical concept of the present disclosure. The scope of the technical concept of the present disclosure is not limited thereto. The protective scope of the present disclosure should be construed based on the following claims, and all the technical concepts in the equivalent scope thereof should be construed as falling within the scope of the present disclosure.

What is claimed is:

1. An organic light emitting display device, comprising:
   a substrate;
   a pixel on the substrate, the pixel including:
     a driving thin film transistor (TFT) on the substrate, the driving TFT including:
       a first active layer formed of poly-Si, and
       at least a first part of an interlayer insulation layer on the first active layer, the interlayer insulation layer formed of a first material including hydrogen;
     a switching TFT on the substrate, the switching TFT including:
       a second active layer,
       at least a second part of the interlayer insulation layer between the first active layer and the second active layer, and
       at least a part of a gate insulation layer between the second part of the interlayer insulation layer and the second active layer, the gate insulation layer formed from a second material different from the first material and blocking diffusion of hydrogen from the interlayer insulation layer to the second active layer; and
     an organic light emitting diode (OLED) electrically connected to the driving TFT.

2. The organic light emitting display device of claim 1, wherein the first material includes silicon nitride ($SiN_x$).

3. The organic light emitting display device of claim 1, wherein the second material includes silicon oxide ($SiO_x$).

4. The organic light emitting display device of claim 1, wherein a hydrogen content of the second material is less than a hydrogen content of the first material.

5. The organic light emitting display device of claim 1, wherein a hydrogen content of a first portion of the gate insulation layer is less than a hydrogen content of a second portion of the gate insulation layer, the first portion closer to the second active layer than the second portion is to the second active layer.

6. The organic light emitting display device of claim 1, wherein a density of a first portion of the gate insulation layer is higher than a density of a second portion of the gate insulation layer, the first portion closer to the second active layer than the second portion is to the second active layer.

7. The organic light emitting display device of claim 1, further comprising a passivation layer disposed over the driving TFT and the switching TFT, wherein at least a portion of the passivation layer contacts the second active layer.

8. The organic light emitting display device of claim 7, wherein a hydrogen content of a first portion of the passivation layer is less than a hydrogen content of a second portion of the passivation layer, the first portion closer to the second active layer than the second portion is to the second active layer.

9. The organic light emitting display device of claim 7, wherein a density of a first portion of the passivation layer is higher than a density of a second portion of the passivation layer, the first portion closer to the second active layer than the second portion is to the second active layer.

10. The organic light emitting display device of claim 7, wherein the passivation layer includes:
    a first passivation layer including silicon oxide ($SiO_x$); and
    a second passivation layer on the first passivation layer and formed of a different material other than silicon oxide (SiOx), the first passivation layer closer to the second active layer than the second passivation layer is to the second active layer.

11. The organic light emitting display device of claim 1, further comprising a bottom shield metal disposed below the first active layer and overlapping with the first active layer.

12. The organic light emitting display device of claim 1, wherein the driving TFT includes a first gate electrode, wherein the switching TFT includes a second gate electrode, wherein the first gate electrode and the second gate electrode are disposed on a same layer.

13. The organic light emitting display device of claim 1, further comprising a storage capacitor on the substrate, the storage capacitor including:
    a first capacitor electrode disposed on a same layer as the first active layer; and
    a second capacitor electrode on the first storage electrode.

14. The organic light emitting display device of claim 13, wherein the switching TFT includes agate electrode on the substrate, and wherein the second capacitor electrode is disposed on a same layer as the gate electrode of the switching TFT.

15. An organic light emitting display device, comprising:
    a substrate;
    a pixel on the substrate, the pixel including:
      a first active layer of a first thin film transistor (TFT) on the substrate, the first active layer formed of oxide semiconductor;
      a second active layer of a second TFT on the substrate, the second active layer formed of poly-Si;
      a first insulation layer between the first active layer and the second active layer, wherein the first insulation layer is formed of a first material including hydrogen;
      a second insulation layer between the first insulation layer and the first active layer, wherein the second insulation layer is formed of a second material different from the first material and blocking diffusion of hydrogen from the first insulation layer to the first active layer; and
      an organic light emitting diode (OLED) on the substrate electrically connected to the second TFT.

16. The organic light emitting display device of claim 15, wherein the first TFT further includes a first gate electrode disposed below the first active layer, and wherein the first insulation layer and the second insulation layer are disposed between the first gate electrode and the first active layer.

17. The organic light emitting display device of claim 15, wherein the first TFT further includes a first gate electrode disposed below the first active layer, and wherein the first insulation layer is disposed below the first gate electrode, and the second insulation layer is disposed above the first gate electrode.

18. The organic light emitting display device of claim 15, wherein the first material includes silicon nitride ($SiN_x$).

19. The organic light emitting display device of claim 15, wherein the second material includes silicon oxide ($SiO_x$).

* * * * *